(12) United States Patent
Martinu et al.

(10) Patent No.: US 12,037,923 B2
(45) Date of Patent: Jul. 16, 2024

(54) PULSE-MANAGED PLASMA METHOD FOR COATING ON INTERNAL SURFACES OF WORKPIECES

(71) Applicant: PRATT & WHITNEY CANADA CORP., Longueuil (CA)

(72) Inventors: Ludvik Martinu, Longueuil (CA); Amaury Kilicaslan, Longueuil (CA); Jolanta Sapieha, Pointe-Claire (CA); Oleg Zabeida, Cote St-Luc (CA); Joel Larose, Longueuil (CA); Etienne Bousser, Longueuil (CA); Elvi Dalgaard, Montreal (CA)

(73) Assignee: PRATT & WHITNEY CANADA CORP., Longueuil (CA)

( * ) Notice: Subject to any disclaimer, the term of this patent is extended or adjusted under 35 U.S.C. 154(b) by 727 days.

(21) Appl. No.: 16/898,853

(22) Filed: Jun. 11, 2020

(65) Prior Publication Data

US 2021/0010378 A1   Jan. 14, 2021

Related U.S. Application Data

(60) Provisional application No. 62/977,985, filed on Feb. 18, 2020, provisional application No. 62/871,388, filed on Jul. 8, 2019.

(51) Int. Cl.
*F01D 5/28* (2006.01)
*C23C 16/04* (2006.01)
(Continued)

(52) U.S. Cl.
CPC ............ *F01D 5/288* (2013.01); *C23C 16/045* (2013.01); *C23C 16/45536* (2013.01);
(Continued)

(58) Field of Classification Search
CPC ............... F01D 5/288; C23C 16/45557; C23C 16/45536; C23C 16/46; C23C 16/045;
(Continued)

(56) References Cited

U.S. PATENT DOCUMENTS

| | | | | |
|---|---|---|---|---|
| 6,410,086 B1 * | 6/2002 | Brandon | ................. | C23C 28/04 |
| | | | | 427/586 |
| 6,416,577 B1 * | 7/2002 | Suntoloa | ................. | C23C 16/46 |
| | | | | 117/88 |

(Continued)

FOREIGN PATENT DOCUMENTS

WO     2009140417 A1   11/2009

OTHER PUBLICATIONS

Wei Jiang and Akira Kobayashi, Research of TiN Coatings by Means of Gas Tunnel Type Plasma Reactive Spraying, 2005, Elsevier Ltd., Novel Materials Processing (MAPEES'04), 427-432 (Year: 2005).*

(Continued)

*Primary Examiner* — Topaz L. Elliott
*Assistant Examiner* — Ryan C Clark
(74) *Attorney, Agent, or Firm* — NORTON ROSE FULBRIGHT CANADA LLP

(57) ABSTRACT

An article has a cavity defined by an inner surface, the cavity having a size such that a largest sphere placeable in the cavity has a diameter of less than 7 cm and a smallest sphere placeable in the cavity has a diameter of 0.5 mm; and a hard coating on the inner surface, the hard coating having a hardness between 18 to 100 GPa, the hard coating distributed on the inner surface such that a ratio of a coating thickness at a first region of the hard coating to that at a second region of the hard coating ranges from 0.75 to 1.33.

8 Claims, 8 Drawing Sheets

(51) Int. Cl.
*C23C 16/455* (2006.01)
*C23C 16/46* (2006.01)

(52) U.S. Cl.
CPC ........ *C23C 16/45557* (2013.01); *C23C 16/46* (2013.01); *F05D 2230/314* (2013.01); *F05D 2230/90* (2013.01); *F05D 2300/506* (2013.01); *F05D 2300/611* (2013.01)

(58) Field of Classification Search
CPC ......... F05D 2300/506; F05D 2300/611; F05D 2230/31; F05D 2230/314; F05D 2230/90
See application file for complete search history.

(56) References Cited

U.S. PATENT DOCUMENTS

| | | | |
|---|---|---|---|
| 8,394,197 | B2 | 3/2013 | Tudhope et al. |
| 2005/0152805 | A1* | 7/2005 | Arnold .................... F01D 5/288 419/42 |
| 2008/0056905 | A1* | 3/2008 | Golecki ..................... F01D 5/14 416/241 R |
| 2008/0102296 | A1* | 5/2008 | Ghasripoor ............. C23C 14/18 427/580 |
| 2009/0011195 | A1* | 1/2009 | Bruce .................... C23C 28/322 204/192.16 |
| 2009/0017230 | A1 | 1/2009 | Tudhope et al. |
| 2011/0151141 | A1* | 6/2011 | Upadhyaya ....... H01J 37/32596 118/723 E |
| 2011/0318549 | A1* | 12/2011 | Schmidt .................. C04B 41/89 428/206 |
| 2012/0021138 | A1* | 1/2012 | Ditizio .............. C23C 16/45536 427/539 |
| 2013/0071562 | A1* | 3/2013 | Szuromi ................ B33Y 70/00 427/237 |
| 2013/0224008 | A1* | 8/2013 | Cheung ................. F01D 25/162 415/208.1 |
| 2014/0141674 | A1 | 5/2014 | Galbreath et al. |
| 2015/0111061 | A1* | 4/2015 | Shen ..................... C23C 28/044 148/121 |
| 2015/0144496 | A1* | 5/2015 | Morris .................... F01D 5/186 205/261 |
| 2015/0176414 | A1* | 6/2015 | Kirkendall ............... C25D 7/04 415/115 |
| 2016/0175983 | A1* | 6/2016 | Chivers ..................... F01D 5/34 219/76.1 |
| 2016/0222796 | A1* | 8/2016 | Spangler ................. F01D 5/189 |
| 2016/0319666 | A1* | 11/2016 | Blumer ................. B23P 15/006 |
| 2017/0009591 | A1* | 1/2017 | Flores Renteria ...... C23C 10/04 |
| 2017/0051616 | A1* | 2/2017 | Giannozzi ............... F01D 5/286 |
| 2018/0156037 | A1* | 6/2018 | Kraus ..................... F01D 5/147 |
| 2018/0209283 | A1* | 7/2018 | Kottilingam ............ B22F 5/009 |
| 2018/0247797 | A1* | 8/2018 | Gorokhovsky ..... C23C 14/0605 |
| 2019/0284694 | A1* | 9/2019 | Knisley ................. C23C 16/405 |
| 2020/0017960 | A1 | 1/2020 | Tudhope et al. |

OTHER PUBLICATIONS

Mohammadtaheri et al., "The Effect of Deposition Parameters on the Structure and Mechanical Properties of Chromium Oxide Coatings Deposited by Reactive Magnetron Sputtering", Mar. 19, 2018, Department of Mechanical Engineering, University of Saskatchewan, https://www.mdpi.com/2079-6412/8/3/111 (Year: 2018).*
Extended European Search Report, EP21157940.4, Jul. 13, 2021.
L. Martinu et al, "PlasmaEnhanced Chemical Vapor Deposition of Functional Coatings", Department of Engineering Physics, Ecole Polytechnique de Montreal, Chapter 9, p. 392-465, 2010.
S. Muhl et al, "The use of hollow cathodes in deposition processes: A critical review", Thin Solid Films, www.elsevier.com/locate/tsf, p. 174-198, Mar. 3, 2015.
D Mihailova et al, "Geometrical features in longitudinal sputtering hollow cathode discharges for laser applications", Journal of Physics D: Applied Physics, stacks.iop.org/JPhysD/45/165201, 10 pages, Mar. 30, 2012.
S. Ma et al, "Parametric effects of residual stress in pulsed d.c. plasma enhanced CVD TiN coatings", Surface and Coatings Technology, pp. 1023-1027, 2001.
R. Wei et al, "Magnetic field enhanced plasma (MFEP) deposition of inner surfaces of tubes", Surface & Coatings Technology, pp. 691-696, 2004.
T. A. Beer et al, "Study of the ignition behavior of a pulsed dc discharge used for plasma-assisted chemical-vapor deposition", Journal of Vacuum Science & Technology A, https://doi.org/10.1116/1.582204, pp. 423-434, 2000.
K.S. Mogensen et al, "Optical emission spectroscopy on pulsed-DC plasmas used for TiN depositions", Surface and Coatings Technology, pp. 41-49, 1998.
K. Kawata et al, "Effects of chlorine on tribological properties of TiN films prepared by pulsed d.c. plasma-enhanced chemical vapor deposition", Thin Solid Films, pp. 38-44, 2002.
D. Lusk et al, "Thick DLC films deposited by PECVD on the internal surface of cylindrical substrates", Diamond & Related Materials, pp. 1613-1621, 2008.
E.J.D.M. Pillaca, "DLC deposition inside of a long tube by using the pulsed-DC PECVD process" Surface & Coatings Technology, pp. 55-61, 2019.

* cited by examiner

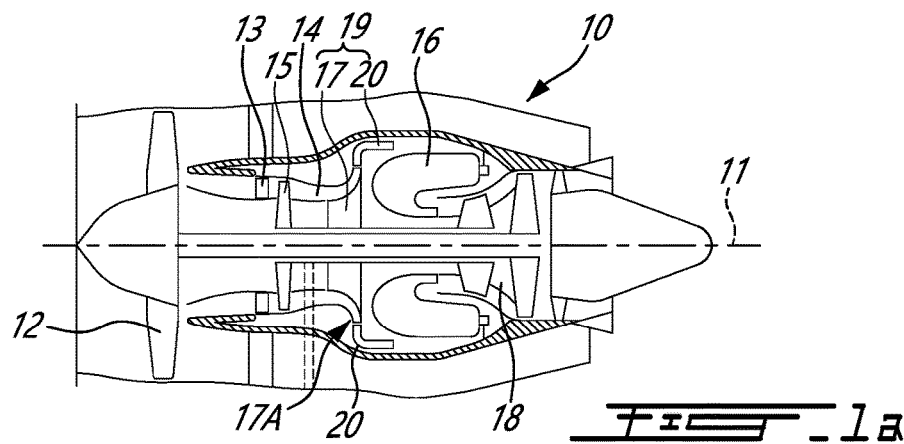
FIG. 1a
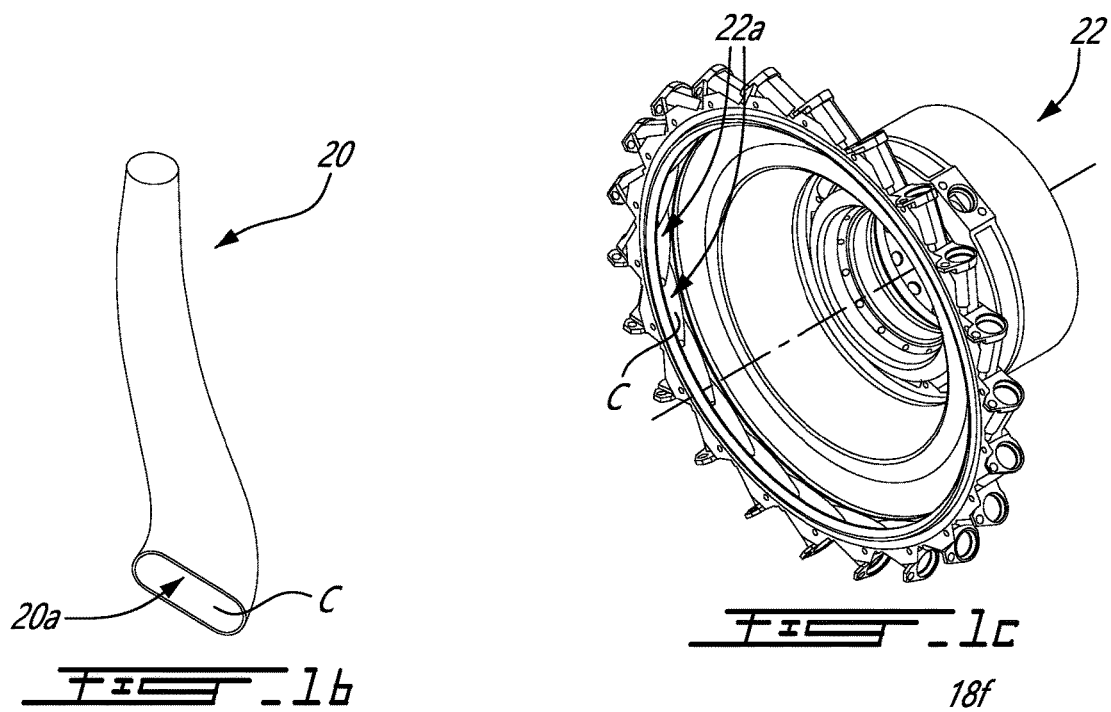
FIG. 1b
FIG. 1c
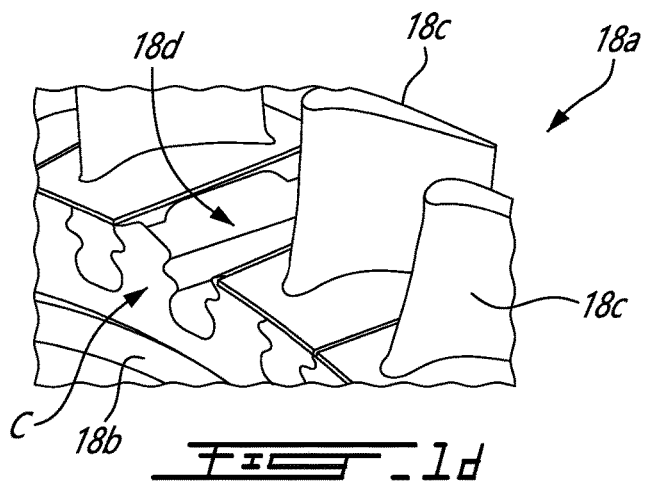
FIG. 1d
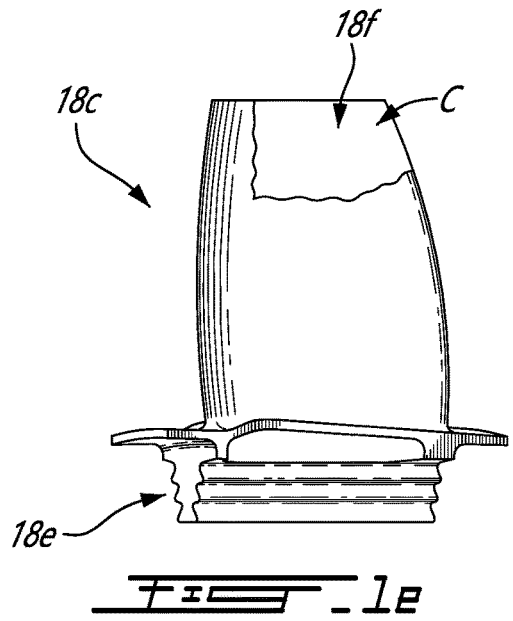
FIG. 1e

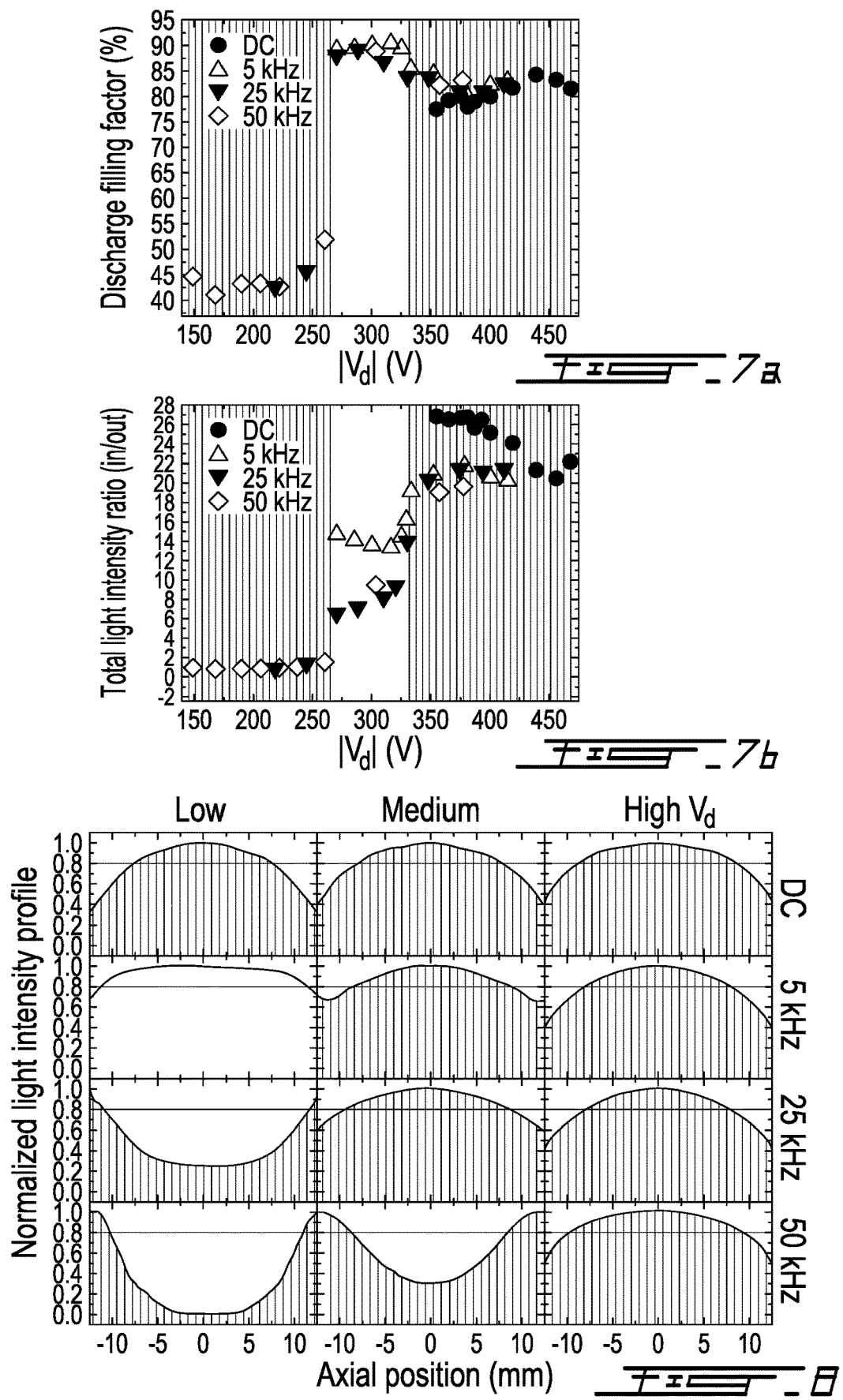

PULSE-MANAGED PLASMA METHOD FOR COATING ON INTERNAL SURFACES OF WORKPIECES

CROSS-REFERENCE TO RELATED APPLICATIONS

This application claims priority from U.S. patent application Ser. No. 62/871,388 filed on Jul. 8, 2019 and U.S. patent application Ser. No. 62/977,985 filed on Feb. 18, 2020, the entire contents of which are incorporated by reference herein.

TECHNICAL FIELD

The application relates to hard coatings resistant to solid particle erosion, articles coated by same, and methods of coating the articles with same.

BACKGROUND OF THE ART

Physical Vapor Deposition (PVD) techniques are based on the liberation of material from a solid source (the target) through physical reactions (evaporation, sputtering). In PVD techniques, the particles travel in a straight line towards the substrate where the coating is grown, making these techniques considered as line of sight. To provide uniform coating, it may be necessary to implement additional tools, leading to different approaches that can be divided in different categories, such as: a) moving the target along the surface to be coated, or b) controlling the direction of the material ejected from the target.

In the case of a tubular system to be internally coated, an approach features a target inserted inside the tube and moved along a central axis of the tube while being sputtered by ions or volatilized by laser. Another approach would have a filament to be sputtered positioned inside the tube, while benefiting from a coaxial configuration. These approaches may have limitations for deposition inside narrow cylinders and small complex geometries because of the limited space allowed for target insertion and process complexity.

To adapt these techniques for narrow cylinders and complex geometries improvements to methods of coating internal part surfaces are therefore desirable. Plasma enhanced chemical vapor deposition may be a promising method for coating internal part surfaces.

SUMMARY

In one aspect, there is provided an article comprising: a cavity defined by an inner surface, the cavity having a size such that a largest sphere placeable in the cavity has a diameter of less than 7 cm and a smallest sphere placeable in the cavity has a diameter of 0.5 mm; and a hard coating on the inner surface, the hard coating having a hardness between 18 to 100 GPa, the hard coating distributed on the inner surface such that a ratio of a coating thickness at a first region of the hard coating to that at a second region of the hard coating ranges from 0.75 to 1.33.

In another aspect, there is provided a method of coating an article with a hard coating, the method comprising: selecting a frequency and/or a duty cycle of a power supply as a function of a size of a cavity of the article to coat with the hard coating such that a ratio of a coating thickness at a first region of the hard coating to that at a second region of the hard coating ranges from 0.75 to 1.33; forming a non-equilibrium plasma inside of the cavity of the article in a plasma enhanced chemical vapor deposition (PECVD) chamber; introducing one or more gases into the PECVD chamber, the one or more gases including one or more inert gases and one or more precursor gases to start a reaction between the one or more precursor gases; and pulsing the power supply with the selected frequency and/or the selected duty cycle of the power supply to coat an inner surface delimiting the cavity of the article with the hard coating having a hardness between 18 to 100 GPa.

In yet another aspect, there is provided a method of coating an article, the article defining an internal passage delimited by an inner surface, the method comprising: vacuuming the inside of the PECVD chamber containing the article; heating the article inside the PECVD chamber; injecting one or more gases into the PECVD chamber, the one or more gases including one or more inert gases and one or more precursor gases including a titanium precursor gas; circulating an electric current through the article while the article is inside the PECVD chamber; and coating the article by forming a non-equilibrium plasma inside of the internal passage of the article and pulsing the electric current at a given frequency and/or at a given duty cycle such that a ratio of a coating thickness at a first region of the hard coating to that at a second region of the hard coating ranges from 0.75 to 1.33 and that a hardness of the hard coating is at least 18 GPa.

DESCRIPTION OF THE DRAWINGS

Reference is now made to the accompanying figures in which:

FIG. 1A is a schematic cross-sectional view of a gas turbine engine;

FIG. 1B is a schematic three dimensional view of a diffuser pipe for a centrifugal compressor of the gas turbine engine of FIG. 1A;

FIG. 1C is a schematic three dimensional view of a diffuser case of the centrifugal compressor of the gas turbine engine of FIG. 1A;

FIG. 1D is a schematic partial three dimensional view of a rotor of the gas turbine engine of FIG. 1A;

FIG. 1E is a schematic partially cut-away front view of a blade of a rotor of the gas turbine engine of FIG. 1A;

FIGS. 7a and 7b are graphs showing the discharge filling factor and the total light intensity ratio in function of the voltage;

FIG. 8 are graphs showing the normalized light intensity profiles for different powers and frequencies.

DETAILED DESCRIPTION

Figure 2A:
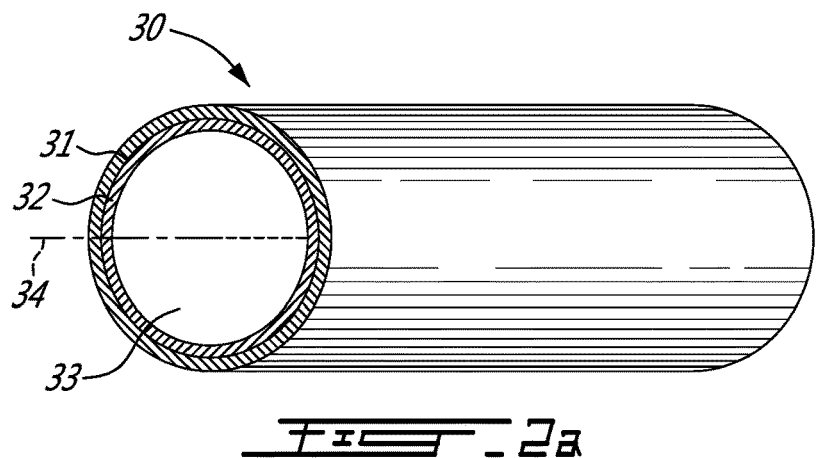
FIG. 2A is a schematic three dimensional view of a tubular piece.

FIG. 1A illustrates a gas turbine engine 10 of a type preferably provided for use in subsonic flight, comprising in serial flow communication along an engine center axis 11 a fan 12 through which ambient air is propelled, a compressor section 14 for pressurizing the air, a combustor 16 in which the compressed air is mixed with fuel and ignited for generating an annular stream of hot combustion gases, and a turbine section 18 for extracting energy from the combustion gases. The compressor section 14 includes a plurality of stators 13 and rotors 15 (only one stator 13 and rotor 15 being shown in FIG. 1), and it includes a centrifugal compressor 19.

Referring to FIGS. 1A to 1C, the centrifugal compressor 19 of the compressor section 14 includes an impeller 17 and a plurality of diffuser pipes 20, which are located downstream of the impeller 17 and circumferentially disposed about a periphery of a radial outlet 17A of the impeller 17. The diffuser pipes 20 convert high kinetic energy at the impeller 17 exit to static pressure by slowing down fluid flow exiting the impeller. The diffuser pipes 20 also redirect the air flow from a radial orientation to an axial orientation (i.e. aligned with the engine axis 11). The diffuser pipes 20 are thus part of a compressor diffuser. In most cases, the Mach number of the flow entering the diffuser pipe 20 may be at or near sonic, while the Mach number exiting the diffuser pipe 20 may be less than 0.25 to enable stable air/fuel mixing, and light/re-light in the combustor 16. The diffuser pipes 20 are secured to a diffuser case 22 at a plurality of circumferentially distributed locations.

Referring to FIGS. 1D and 1E, the turbine section 18 of the gas turbine engine 10 includes rotors and stators, a rotor being shown at 18a. The rotor 18a includes a rotor disk 18b and blades 18c secured to the rotor disk 18b. The rotor disk 18b defines a plurality of grooves 18d each configured to slidably receive therein a respective one of roots 18e of the blades 18c. The blade 18c of the rotor 18a of the turbine section 18 define a hollow portion 18f fluidly connected to a source of cooling air to maintain the turbine blade 18c within acceptable temperature.

Many environmental conditions may contribute to degradation of aircraft workpieces (e.g., diffuser pipes 20, diffuser case 22, blades 18c, and rotor disk 18b), such as solid particle erosion (SPE) by particles entering the engine through air intake or corrosive attack. There exist solutions to prevent the ingestion of such particles inside the engine, one example being particle filters. The application of SPE-resistant coatings on the surface of the engine's components is also used to mitigate the degradation of workpieces. Coating convex (outside) surfaces of components such as compressor blades is a well-known and commercially available process. However, the aircraft engine comprises numerous components, a non-exhaustive list is presented herein above, (or articles) that possess cavities with inner surfaces, such as concave inner surfaces, that may be difficult to protect by SPE-resistant coatings.

To help those aircraft components to withstand the harsh conditions to which they are subjected, a coating C is applied to inner surfaces of those components. Namely, the coating C is applied on an internal surfaces 20A of the diffuser pipes 20, on an internal surfaces 22a of conduit portions of the diffuser case 22, on a peripheral surface of the grooves 18d, and on walls defining the hollow portion 18f of the blades 18c of the rotor 18. These coatings may increase protection of these aircraft components to SPE. These engine components are shown as having straight sections and/or circular tube simply as an example. Any article defining a cavity that is curved, non-circular, narrowing, tapering, tortuous, etc may be coated using the techniques disclosed herein.

Coatings

Many coatings exist, however, it is a challenge to coat internal surfaces of articles. Certain internal surfaces may be coated by physical vapor deposition (PVD). However, such a technique requires inserting targets into cavities of the article. This may complicate the coating process design and operation for some kind of articles, such as hollow articles. Another possibility may be to sputter or evaporate the target using high voltages leading to a high ion-to-neutral particle ratio, and to use a magnet and/or a bias on the cylindrical sample to condense the vapor. The control of the ejected material direction is limited, and sometimes additional rotation of the sample is required. The complexity of some components and the limitations mentioned above makes these techniques challenging to implement in an industrial setting.

Diamond-like carbon (DLC) coatings may be used for providing corrosion or abrasion resistance, but in at least some applications their solid particle erosion resistance is limited. In other words, DLC has proven difficult to provide sufficient SPE resistance to aircraft parts, such as the diffuser pipe 20 discussed above. When deposited by PECVD inside tubes using radiofrequency plasma, the DLC coatings may be uniform along the tube length. However, DLC coating may not be suitable because of their limited SPE resistance.

Coatings that provide sufficient SPE resistance include hard coatings for example, hard transition metal nitrides such as titanium nitride and similar materials. To apply those coatings, a traditional plasma enhanced chemical vapor deposition method (PECVD) may be used.

For the purposes of the present technology, hardness of the coating may be at least as high as the eroding particle(s) to which the coating may be subjected when in use. The term "hard" when used herein to refer to a coating, means the coating has a hardness of between about 10 GPa to about 100 GPa. In some embodiments as presented herein, the coatings C that are used to coat the internal surfaces of the above-described components have a hardness of between about 18 to about 100 GPa. In some embodiments as presented herein, the coating has a hardness of between about 22 to about 60 GPa. In some embodiments as presented herein, the coating has a hardness of between about 22 to about 55 GPa. It will be appreciated that the minimum hardness is dependent upon where this coating is to be applied. However, in all cases, these internal surfaces have a coating having a hardness that is above that of a DLC coating. The coatings that are used herein to provide the desired hardness are, for instance, titanium nitride coatings.

These coatings may be applied using Chemical Vapor Deposition (CVD) techniques that are based on the dissociation of a gas phase precursor containing suitable elements to complete coating synthesis, and a source of energy to activate the reactions on the inner surface of the substrate.

The source of energy can simply be substrate heating for thermal CVD, or the process can be assisted (enhanced) by plasma (PECVD) for precursor activation and gas species excitation, thus reducing the temperature of the process. When only the substrate is either heated or powered, it becomes the source of energy in the deposition chamber and because it is immersed in a gaseous environment, the chemical reactions are activated on all surfaces in contact and in the gas phase near them. The PECVD approach is particularly suitable when the diameter of the tube is only several cm or even less than one centimeter, or the cavity is of an irregular shape including a curved profile, elbow, corner, slit, trench, and the like. However, this approach is not limited to small diameter tubes and can be applied to surfaces of larger dimensions.

Compared to the deposition of DLC from hydrocarbon precursors, the deposition process of TiN from $TiCl_4$ is more complex and very sensitive to the plasma-bulk and plasma-surface energetic conditions and to the electronegativity of precursors. Moreover, it was demonstrated that, depending of the shape and/or dimension of the internal surface of the cavity of the article to coat, a thickness of the coating is non-uniform and exhibits an inhomogeneity of composition and microstructure along the inner surface.

Moreover, at low power density, molecular dissociation in the gas phase may be restricted, and surface reactions may become more important. Specifically, the precursor molecules adsorbed on the heated surface (400-450° C. for example) react with $H_2$ molecules to form HCl, removing the Cl atoms from the surface, while N atoms (from $N_2$ dissociation) react with Ti (adsorbed on the surface via $TiCl_x$ molecules) to form the TiN coating.

At low power, the precursor may be dissociated in the gas phase, as its dissociation energy is lower than $N_2$ and $H_2$. Then, with the increase of the power, the $Ti^+$, $N_2^+$ and $Ar^+$ ions originating from the gas phase are attracted by the negative voltage of the substrate surface, leading to the TiN coating formation. Most of the molecules are dissociated, leading to the formation of TiN directly in the gas phase, in contact with the surface, which forms the TiN coating.

Either the adsorption of $TiCl_x$ on the surface or its dissociation in the gas phase could control the growth of the TiN coatings. However, in both cases, the diffusion of the precursor in the gas phase is involved. Also, a correlation between the growth mode of TiN and the plasma density is considered very important. As will be discussed herein below, the plasma density may be qualitatively correlated with the light intensity emanating from the plasma region. This may give a possibility to optimise the coating uniformity on basis of evaluating the space distribution of the light intensity inside the article.

In PECVD, the reaction between the one or more reactive gases may be the limiting factor that determines the deposition rate of the hard coating. For example, in the case of TiN coating the reaction of active N with Ti is the main limiting factor that determines the deposition rate. Therefore, at low power the deposition rate increases with power since more $TiCl_4$ and $N_2$ molecules are dissociated. However, a reverse effect is observed at powers higher than 40 W under specific conditions, which has been attributed to a high flux of ions and fast neutrals impinging the surface, while limiting the coating growth by re-sputtering effects. Consequently, depending on the power density and the range of energy and flux of ions during the PECVD process, deposition and sputtering can occur in competition.

It was observed that deposition of TiN coatings using a traditional PECVD method results in a non-uniformity of the coating. For a tube, this is shown by having a greater coating thickness at edges of the tube than at its center. This problematic is present in the case of direct current (DC) and continuous waves radio-frequency (CW RF) at high bias voltage values, when the most dense plasma is concentrated in the center of tubes.

The method disclosed herein may be used to coat the middle of a tube with a uniform thickness of coating between the edge and the middle of the tube by using, for example, a non-equilibrium plasma powered by a lower bias voltage in the P-DC mode at 5 kHz. One of the advantages of P-DC compared to DC is that at similar gas composition, pressure and applied power the uniform hollow cathode discharge can be ignited in tubes with smaller diameters thus extending the range of articles that can be coated by this method. More details about those methods are presented herein below.

Although only a few examples of aircraft engine components defining internal surfaces in need of SPE protection have been shown, it will be appreciated that any engine components presenting an internal surface, defined either by inner walls of a conduit (e.g., diffuser pipe), or by an inner cavity (e.g. groove of the rotor disk) may be coated.

More specifically, the coating techniques disclosed herein are tailored toward the components described above and having an internal surface, defined either by an internal cavity or an internal passage, that meets the following criteria: 1) having a size such that a largest sphere that can be entirely placed in the internal passage or cavity has a diameter of about 7 cm or less, regardless of a length of the cavity or its shape (including bent or convoluted internal cavities and trenches); and 2) having a size such that a smallest sphere that can be entirely placed in the internal cavity or passage has a diameter of at least 0.5 mm. The internal cavity or passage may be of any complex or irregular shape, with at least one surface curving inwards. Any cross-section of the internal cavities can exhibit a closed perimeter, an open surface, or both. An open surface is referred to as a cavity that is not enclosed all around its circumference. A groove is an example of an open surface. To the contrary, an internal passage of a tube is considered as a closed surface. In some embodiments, the internal cavity or passage may further be defined as having a size that allows a tube with an aspect ratio (length over diameter) of about 5 or less to fit within the internal cavity. Any of the engine components described above with reference to FIGS. 1B to 1E respect criteria 1) and 2) detailed above.

The minimum dimension is to ensure that a plasma is created inside the cavity. Too small of a cavity may prevent a plasma from forming and, hence, prevent a coating to be deposited on the surface. Stated otherwise, the internal cavity/passage has a minimum dimension to ensure that a plasma is able to efficiently coat the internal surfaces. This minimum dimension is correlated with a plasma parameter called Debye length. The Debye length is defined as a distance over which mobile charge carriers screen out electric fields in plasmas. In the plasma of electric discharges, such as the ones considered here, the Debye length depends on the main plasma parameters and can be expressed as:

$$\lambda_D = \sqrt{\frac{\varepsilon_0 k_B T_e}{n_e q_e^2}}$$

where
$\lambda_D$ is the Debye length,
$\varepsilon_0$ is the permittivity of free space,
$k_B$ is the Boltzmann constant,
$q_e$ is the charge of an electron,
$T_e$ is the temperature of the electrons,
$n_e$ is the density of electrons.

In the plasma described herein the Debye length is typically in the range of 0.1 mm, such as between 0.05 mm and 0.15 mm. In the present case, the minimum dimension of the internal cavity/passage is at least 10× larger than the Debye length of the plasma such that a plasma can be created in the internal cavities.

It will be appreciated that external plasmas and remote plasma sources may be additionally used. An external magnetic field can be used to improve the plasma confinement, plasma density and/or uniformity. The external magnetic field is external to the plasma of the PECVD as in the external magnetic field may substantially englobe the plasma. For example, external static magnetic fields created by rod-type magnets (RTMs) or disk-type magnets (DTMs) can have an effect on the physical properties of the coating including the phase composition and crystallinity. An external plasma may be used to influence the field of the internal plasma and electron movements which may in turn influence the chemical reaction and coating deposition.

Figure 2B:
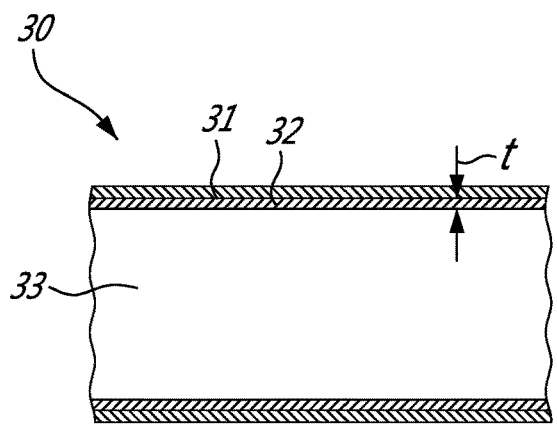
FIG. 2B is a schematic partial cross-sectional view of the tubular piece of FIG. 2A.

Referring now to FIGS. 2A, 2B, a tube is shown at 30. The tube 30 has an internal cavity in the form of an internal passage 33 delimited by an inner surface 31 coated with a coating 32. The tube 30 extends longitudinally along a central axis 34. In the embodiment shown, the tube is made of stainless steel SS410 and an internal diameter taken at the inner surface 31 of 7 mm. A length of the tube 30 is 25 mm. An aspect ratio of the tube 30 is therefore 3.6.

It will be appreciated that the tube 30 may have any other shape. For instance, a cross-sectional area of the tube taken along a plane normal to the central axis 34 may vary along said central axis 34. The tube 30 may be curved. When a shape is irregular, for instance if a diffuser pipe 20 (FIG. 1B) is considered, an effective aspect ratio may be used. The effective aspect ratio is defined by a ratio of a length to a mean hydraulic diameter. The mean hydraulic diameter is a mean of a plurality of hydraulic diameters of the internal passage taken at a plurality of locations along the central axis 34 of the internal passage 33. Each of the plurality of the hydraulic diameters corresponds to a ratio of four times a cross-sectional area of the internal passage 33 at a respective one of the plurality of locations taken along a plane normal to the central axis 34 to a perimeter of the internal passage 33 at the respective one of the plurality of locations. The method disclosed herein are suitable to uniformly coat any article having an effective aspect ratio of about 3.6 or more.

The coating 32 on the tube 30 has a hardness suitable for solid particle erosion (SPE). This hardness is at least 18 GPa, preferably greater than 22 GPa, preferably greater than 28 GPa. Those coatings, such as titanium nitride coatings, typically have a hardness less than 100 GPa, typically at most 55 GPa, and at least 18 GPa.

The coating 32 has thickness t of about 0.5 to about 50 μm or more. It will be appreciated that the thickness of the coating for engine components (e.g., diffuser pipe 20, FIG. 1B) is selected in function of the intended use of the component and of the component itself. For instance, the thickness t of the hard coating C of the engine components described above with reference to FIGS. 1B to 1E range from about 0.5 to about 50 μm, in some cases, from about 10 to about 20 μm, in some other cases, from about 3 to about 20 μm. For instance, the diffuser pipe 20 may have a coating having a different thickness of that of a turbine blade since they are not operating in the same operating conditions; temperature in the turbine section 18 of the engine 10 are greater than that in the diffuser pipe 20.

The hard coating 32 is uniformly distributed along the inner surface 31. The uniform distribution can be assessed by normalizing the coating thickness along the coated inner surface of the component. The uniformity is herein defined as a ratio of a coating thickness t at a first region of the hard coating to that at a second region of the hard coating. To be considered "uniform", the ratio ranges from about 0.75 to about 1.33. Preferably, the ratio of the coating thickness ranges from 0.8 to 1.25. A "perfect" uniformity would be a ratio of 1 taken at any two regions of the coating. The coatings C of the aircraft workpieces are uniform per the above definition of uniformity.

The hard coating 32, C resistant to SPE on the inner surface 31 of the tube 30, and on aircraft workpieces of FIGS. 1B to 1E, of the present disclosure is a hard polycrystalline coating, herein titanium nitride. It may alternatively be a hard X-ray amorphous coating, a hard nanocomposite coating or a hard nanolaminate coating. The hard polycrystalline coating is herein a titanium based hard polycrystalline coatings. The titanium based hard polycrystalline coating may be TiN, TiCN, TiCrN, TiCCrN, TiSiN, TiSiCN or the like. The hard polycrystalline coating is herein TiN which has face centered cubic (FCC) polycrystallinity. The titanium based hard polycrystalline coating resistant to solid particle erosion may include Ti and N at a ratio N/Ti of from about 0.2 to about 2, preferably from about 0.9 to about 1.1 or be preferably about 1. The coating can also be a metal nitride, metal carbide or metal boride. The metal may be a transition metal.

Plasma-Enhanced Chemical Vapor Deposition System

Figure 3A:
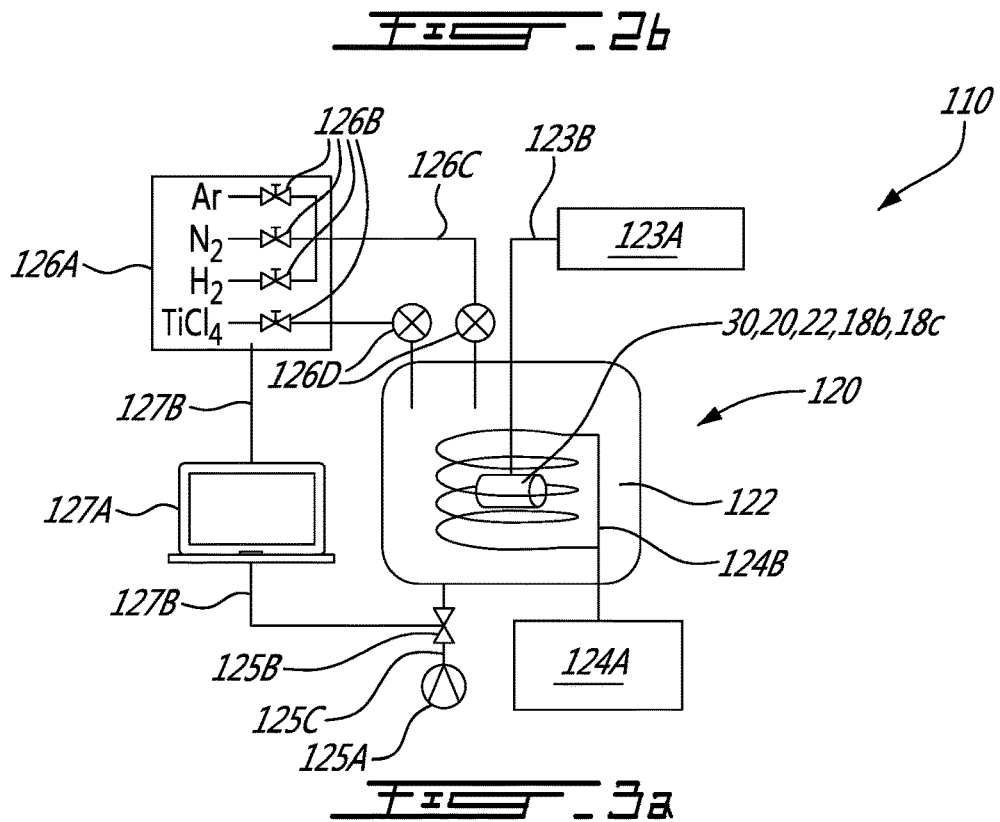
FIG. 3A is a schematic view of a plasma-enhanced chemical vapor deposition (PECVD) system in accordance with one embodiment.

Referring now to FIG. 3A, a plasma-enhanced chemical vapor deposition (PECVD) system is shown at 110. The system 110 is described above and is used to coat the tube 30. It will be appreciated that the same system 110 is used to coat any of the other aircraft engine components, such as the diffuser pipe 20, the diffuser case 22, the rotor disk 18b, the rotor blade 18c, that are described herein above with reference to FIGS. 1B to 1E. After the system 110 is described, the parameters and method used to coat the tube 30 with the system 110 are described.

The PECVD system 110 has a PECVD chamber 120 to receive in an interior 122 thereof an article to coat. The system 110 has a power supply 123A electrically connected to the article (e.g. tube 30) by any suitable electrical connection 123B. An electrical circuit is formed between the tube 30 and walls of the chamber 120 or any grounded surface in the chamber 120 through the plasma surrounding the article. The power source of the electric circuit may be the same power source that generates the plasma. The power supplied may be Direct Current (DC), Pulsed Direct Current (P-DC), mid-frequency, Radio Frequency (RF), a combination thereof or a superimposition thereof. A heating element 124B is operatively connected to an electrical source 124A and provides heat to the tube 30 in the PECVD chamber 120. In one embodiment, the power source of the plasma is P-DC and the substrate is heated by radiation through a resistive heating element to a temperature, for example, of between about 400 to about 500° C. The plasma of the present method is a non-thermal plasma also known as a non-equilibrium plasma because it is not in thermodynamic equilibrium. A vacuum pump 125A is hydraulically connected to the chamber 120 and is used to reduce a pressure in the chamber 120. In general a small cavity may require a higher pressure for coating with PECVD. The vacuum pump 125A may be a mechanical pump, a diffusion pump, a turbomolecular pump and/or any other appropriate pump. A valve 125B is hydraulically connected to a conduit 125C to regulate the pressure in the chamber 120.

The system 110 includes a gas system 126A having containers to contain gases used for the coating process. In the embodiment shown, the gas system 126A includes containers of an inert gas, which is herein Ar, one or more reactive gases, which is herein $N_2$, and one or more precursor gases, which are herein $H_2$ and $TiCl_4$. The precursor gases may be stored as solid, liquid or gas phase. However, the coating precursors are preferably provided to the PECVD chamber 120 in gaseous state. It will be appreciated that those gases are selected in function of the desired coating (e.g., TiN). In the present cases, the above mentioned gases are used to coat the tube 30 with a titanium nitride coating.

Each containers of the gases is herein hydraulically connectable to the chamber 120 via a respective valve 126B and a respective conduit 126C. Any suitable valve may be used. A control system 127A is operatively connected (e.g., including connection to the valves 126B and/or 126D) to the gas system 126A, herein via a wired connection 127B and to the pump 125C via suitable connections to control the gas flow rates and internal pressure of the chamber 120. The control system may be any appropriate system that is automated, semi-automated or manual. For example, the control system is a computer. Therefore, although not shown, appropriate sensors may be present to ensure an appropriate mixture and/or pressure of gases is delivered to the chamber 120. For example, an optical emission spectrometry may be used to monitor the plasma discharge or a residual gas analysis to track the gas composition, or other parameters.

The precursors gases may be metal halides, organometallic compounds or a combination thereof. The coating precursors may react with one or more other reactive gases such as those forming the solid (nitrogen, methane, oxygen, or a combination thereof) and a volatile disposable product (hydrogen, chlorine, or combination thereof) and one or more inert gases acting as working gases (argon, helium, neon, or combinations thereof). The particular example shown in FIG. 3A allows for the deposition of TiN coating on the inner surface of the article 30. The deposition of TiN coatings by PECVD involves numerous species including the four working gas constituents (i.e., Ar, $H_2$, $N_2$ and $TiCl_4$) and molecular fragments upon dissociation (H, N, Cl, $TiCl_x$, 0<x<3), while many of them are ionized or in an excited state. The overall reaction that occurs is shown below:

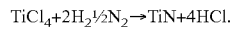

$TiCl_4 + 2H_2 + \frac{1}{2}N_2 \rightarrow TiN + 4HCl.$

In general, the precursor may be dissociated and will react in the gas phase or at the substrate surface, depending on the energetic conditions for the growth of TiN from $TiCl_4$ by PECVD. The process is further assisted with ion bombardment and with the substrate temperature having an important impact on the coating microstructure and properties.

More detail about plasma are presented in Kilicaslan, A., Zabeida, O., Bousser, E., Schmitt, T., Klemberg-Sapieha, J. E., & Martinu, L. (2019). Hard titanium nitride coating deposition inside narrow tubes using pulsed DC PECVD processes. Surface and Coatings Technology, 377, 124894, the entire contents of which are incorporated by reference herein.

Coating Methods

Figure 3B:
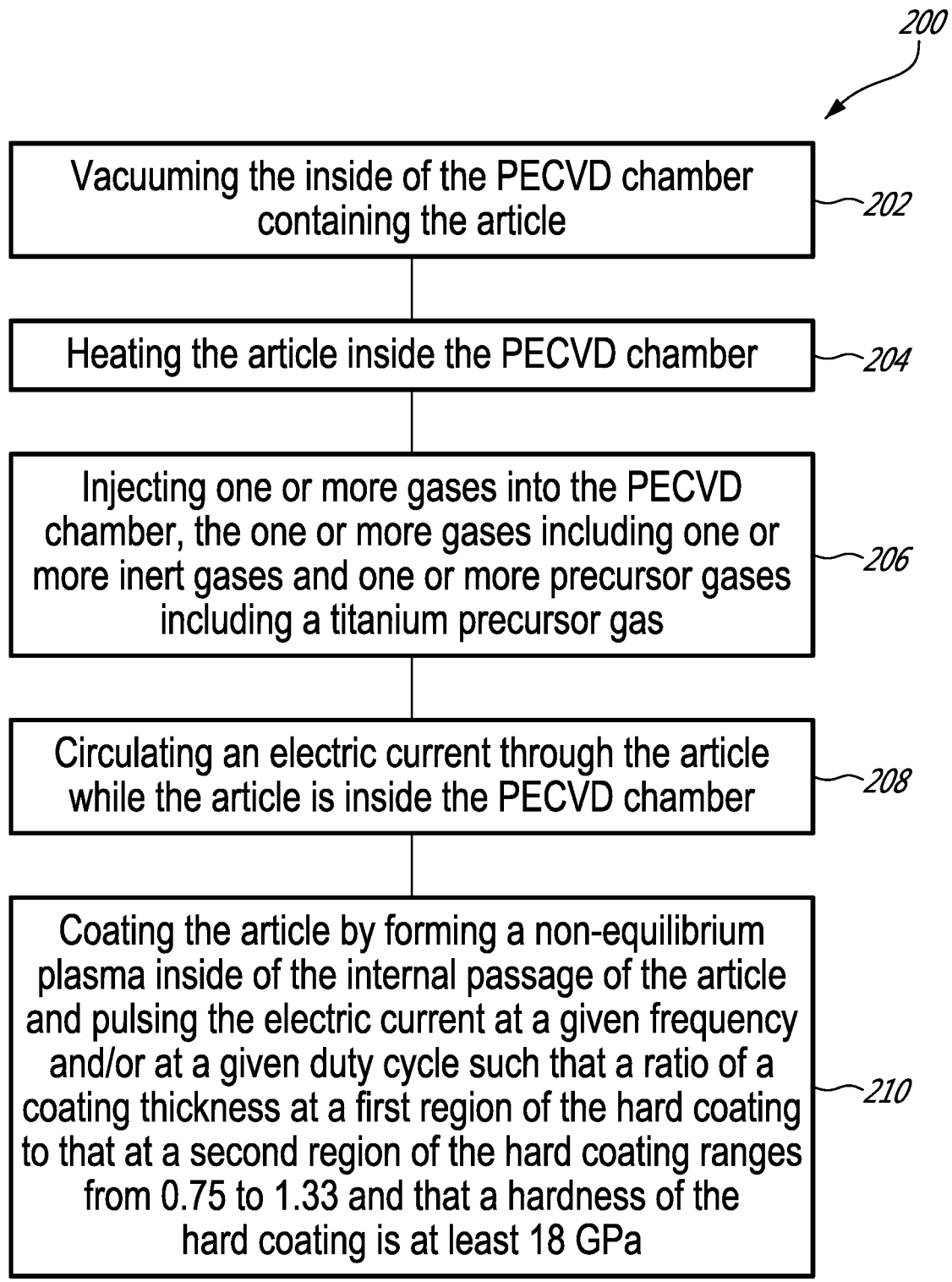
FIG. 3B illustrates steps of a method of coating an article using the PECVD system of FIG. 3A.

Referring now to FIGS. 3A-3B, a method of coating an article, herein the tube 30, using the PECVD system 110 is shown at 200. The method 200 includes the steps of vacuuming the inside of the PECVD chamber containing the article, 202; heating the article inside the PECVD chamber, 204; injecting one or more gases into the PECVD chamber, the one or more gases including one or more inert gases and one or more precursor gases, the one or more precursor gases including a titanium precursor gas, 206; circulating an electric current through the article while the article is inside the PECVD chamber, 208; and coating the article by forming a plasma inside of the internal passage 33 (FIG. 2A) of the article and pulsing the electric current at a given frequency and/or at a given duty cycle, 210. It will be appreciated that the tube 30 is placed inside the chamber 120 before the chamber 120 is vacuumed.

In the embodiment shown, coating the article includes coating the article having an effective aspect ratio of the article is about 3.6. In the present case, the tube 30 is cylindrical and has a constant cross-sectional area along its central axis 34. Hence, the effective aspect ratio of the tube 30 corresponds to its aspect ratio, which corresponds to a ratio of its length to its diameter.

In the present embodiment, the coating 32 on the tube 30 is a titanium nitride coating and is obtained by: vacuuming of the inside of the PECVD chamber 120 includes vacuuming the inside of the PECVD chamber to a pressure of about 750 mTorr; heating the article at a temperature ranging from about 20 to 1000 degrees Celsius, preferably from about 400 to 500 degrees Celsius; injecting argon at a volumetric flow rate of 175 sccm of argon, injecting nitrogen at a flow rate of 25 sccm, injecting hydrogen at a flow rate of 90 sccm, and injecting $TiCl_4$ at a flow rate of 10 sccm; and pulsing the power supply at the given frequency of 5 kHz and at a power of about 23 W.

For experimentation purposes, the tube 30 is coated with TiN with two different methods: 1) TiN coating deposition by radio frequency PECVD; and 2) TiN coating by deposition by P-DC PECVD. The latter corresponds to the coating method 200 described above with reference to FIG. 3B. The following lines describes how the TiN coatings is applied using the PECVD system 110 described herein above with reference to FIG. 3A. As will be discussed herein after, the selection of some parameters for both methods improve coating thickness uniformity.

1) TiN Coating Deposition by Radio Frequency PECVD

TiN coating was deposited according to a traditional continuous waves radio-frequency (CW RF) plasma on the inner surface of the tube 30. Prior to the deposition, the tube inner surface 31 is polished to a mirror-like finish, successively cleaned in a degreasing solution, acetone and isopropanol for 10 min using an ultrasonic bath. Subsequently, the tube 30 is inserted into the deposition chamber 120 while being electrically connected to the power supply 123A, and heated by radiation to a temperature of 450° C. using the heating element 124B. The deposition chamber 120 is evacuated by the mechanical pump 125C and a diffusion pump to a base pressure below $1 \times 10^{-2}$ mTorr. Before deposition, the surface 31 of the tube 30 is sputtered cleaned in an Ar plasma for 10 min at a pressure of 400 mTorr and a bias of −300 V. The volumetric flow rates of the gas flows were Ar 75 sccm, TiCl$_4$ 10 sccm, N$_2$ 25 sccm, and H$_2$ 70 sccm. It will be appreciated that, after the chamber 120 is vacuumed at a given pressure, the pressure inside the chamber 120 increases during the coating process because of the gases injected therein.

The TiN coating 32 is deposited using pulsed radio-frequency (P-RF) PECVD at 350 mTorr on the tube 30. The input gas flows were as follows: Ar 175 sccm, N2 25 sccm, H2 90 sccm and TiCl4 10 sccm. The total (average) power was kept constant at 23 W. The pulsing conditions are summarized in table 1 below. The RF discharge power was controlled using an Advanced Energy RFX-600 (600 W) power supply in combination with a SerenTM MC2 matching unit for the CW RF mode, while the RF power was pulsed using a function generator (Hewlett Packard 3315A).

Results for Method 1)

Figure 4A:
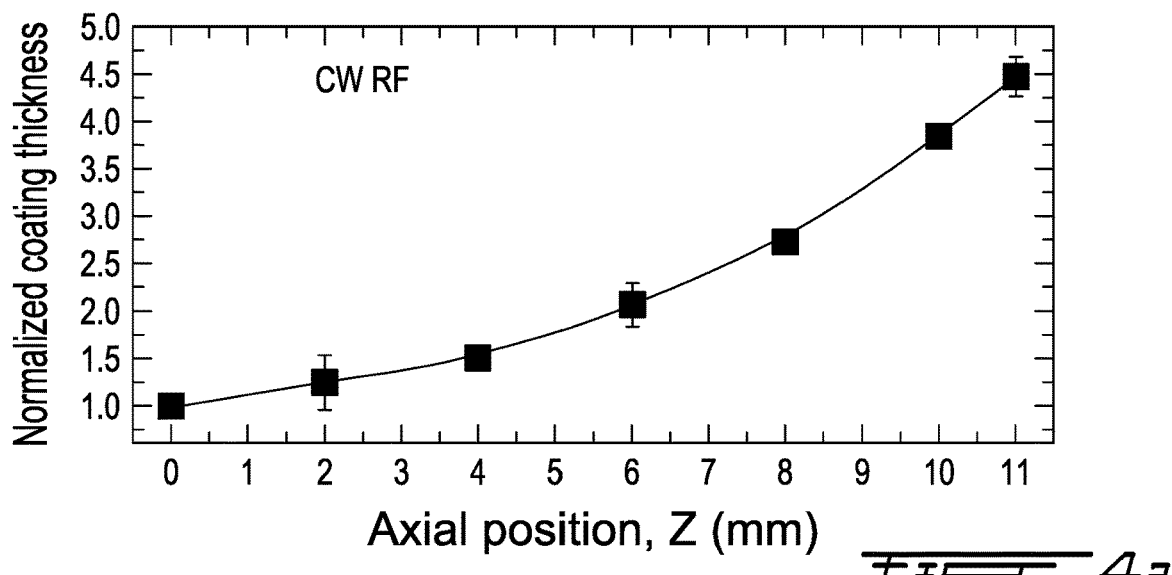
FIGS. 4a to 4c are graphs showing a normalized coating thickness as a function of an axial position of the tube of FIG. 2A for different parameters of a radio-frequency (RF) plasma.
Figure 4B:
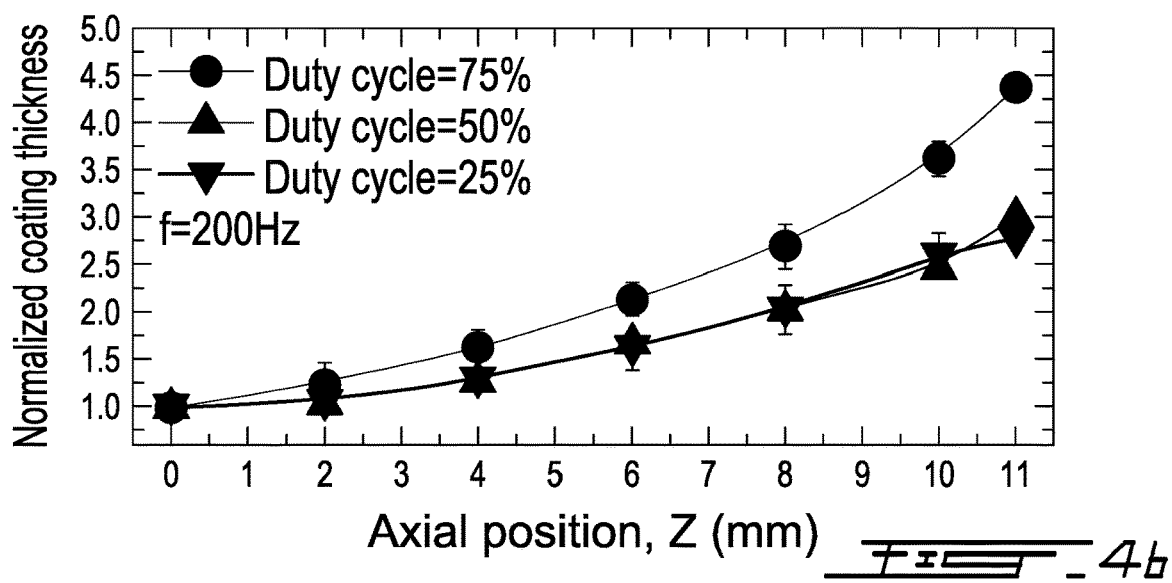
Figure 4C:
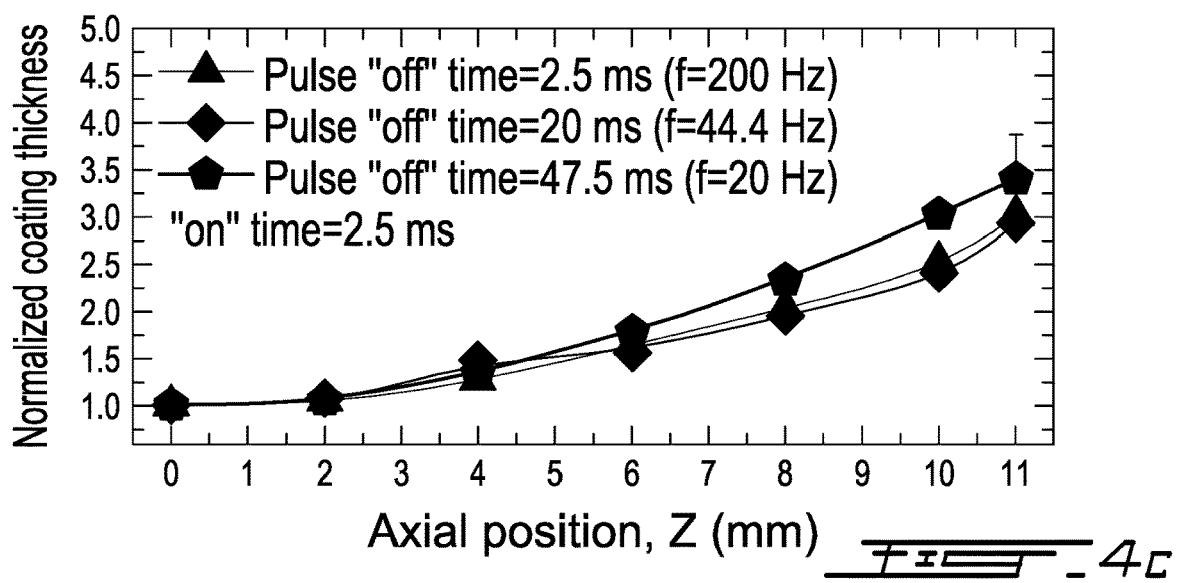

Referring now to FIGS. 4a, 4b, and 4c, normalized coating thicknesses are plotted for different operating conditions of the PECVD system 110 (FIG. 3A) in function of an axial position relative to the central axis 34 (FIG. 2A) of the tube 30. A center of the tube 30 corresponds to an axial position of 0.

FIG. 4a shows an exemplary coating thickness distribution using a continuous waves radio-frequency PECVD method while FIGS. 4b-4c show coating thickness distributions using the plasma radio-frequency (P-RF) method described herein above when using different frequencies and duty cycle.

The parameters were chosen to illustrate the influence of the P-RF frequency and the plasma "off" time on the axial thickness distribution. Both times "on" and "off" were varied, with duty cycles of 75%, 50% and 25%, to keep the pulse frequency constant at f=200 Hz (results shown in graph b)). The frequency was set sufficiently low to ensure a deposition rate on the edges (respectively 3.3 μm/h, 2 μm/h and 1.6 μm/h) comparable to that of the CW RF discharge (4 μm/h). The plasma "on" time was adjusted to a value of 2.5 ms, while the plasma "off" time was set to 20 ms and 47.5 ms, corresponding to a frequency of 44.4 Hz and 20 Hz, respectively (results shown in FIG. 4c)). Since the average power was kept constant at 23 W (the same as the CW RF), the mean bias voltage decreased with the increase of the time "off". However, for FIG. 4b, the power was delivered during the same period of the pulse oscillation ("on"+"off"=5 ms), while for FIG. 4c, the power was delivered during the same time "on" (2.5 ms). These simulations were meant to illustrate the effect of different pulse parameters (frequency, time "off" and time "on") on the precursor diffusion inside the tube and hence the TiN coating thickness distribution.

Referring to FIG. 4a, the normalized thickness profile for the TiN coating deposited in the CW RF discharge has a value at the edges that is 4.5 times higher than in the middle of the tube. This illustrates the non-uniformity that is discussed herein above. Referring to FIG. 4b, the profile obtained for P-RF depositions with a duty cycle of 75% exhibits approximately the same non-uniformity factor of 4.5 between the edges and the middle of the tube, while it decreases to 3 for P-RF with duty cycles of 50% and 25%. Hence, varying the duty cycle may improve coating thickness uniformity.

Referring to FIG. 4c, this factor remained the same even if the pulse "off" time was increased to 20 ms and it slightly increases to 3.5 for the plasma "off" time of 47.5 ms. The residence time of a TiCl$_4$ molecule to travel through the whole tube was estimated to be less than 1 ms, which is lower than the "off" time used in P-RF.

For all coating thickness profiles presented in FIGS. 4a to 4c, the shapes of the plot lines do not change either with the pulse duty cycle or with the frequency. Therefore, the coating thickness axial non-uniformity remained almost the same and is independent of the plasma "off" time either a fixed or a varied frequency, and it also remains the same for P-RF with a duty cycle of 75% in comparison with the CW RF discharge.

The TiN coatings produced by CW RF and P-RF had a coating thickness profile non-uniformity that remained constant independently from the time "off" in the range tested. This time "off" was meant to provide sufficient time for the precursor molecules to diffuse inside the tube and help to establish a uniform precursor distribution possibly leading to a uniform coating thickness profile. The diffusion of TiCl$_4$ in the gas phase was not the main mechanism involved in the lack of uniformity since the residence time of the molecule is at least 10 times lower than the pulse "off" time. It is worth to note that the minimum time "on" used was 1.25 ms which was $1.7 \times 10^4$ times the period of RF oscillations. Even under such conditions, the discharge should have had sufficient time to reach a steady state. Essentially, the time during the P-RF discharge was "on" can be regarded as the CW RF discharge turned "on" for such period. In other words, the effect of the P-RF was the same as the CW-RF, the only difference was the time the discharge was effectively used, according to the decrease in the deposition rate.

TABLE 1

P-RF plasma parameters

| Frequency (Hz) | Duty cycle (%) | Pulse time "on" (ms) | Pulse time "off" (ms) | Bias (V) |
|---|---|---|---|---|
| 200 | 25 | 1.25 | 3.75 | −100 |
| 200 | 50 | 2.5 | 2.5 | −170 |
| 200 | 75 | 3.75 | 1.25 | −225 |
| 44.4 | 12.5 | 2.5 | 20 | −80 |
| 20 | 5.3 | 2.5 | 47.5 | −37.5 |

2) TiN Coating by Deposition by P-DC PECVD

TiN coating was deposited using pulsed P-DC PECVD at 750 mTorr on SS410 tubes 30 (FIG. 2A) having an internal diameter of 7 mm and a length of 25 mm. The gas flows were as follows: Ar 175 sccm, N$_2$ 25 sccm, H$_2$ 90 sccm and TiCl$_4$ 10 sccm. The total (average) power was kept constant at 23 W. An Advanced Energy Pinnacle™ Plus power supply (5 kW) was used in the DC and P-DC regimes, as an example. The pulsing conditions are presented in table 2 below.

TABLE 2

Plasma parameters and deposition rate results

| Excitation type | Frequency | Duty cycle (%) | Power (W) | Bias (V) | Deposition rate (μm/h) at the edge | Deposition rate (μm/h) at the middle |
|---|---|---|---|---|---|---|
| RF | 13.56 MHz | — | 75 | −350 | 11.5 | 0 |
| DC | — | — | 11 | −400 | 8.5 | 0 |

TABLE 2-continued

Plasma parameters and deposition rate results

| Excitation type | Frequency | Duty cycle (%) | Power (W) | Bias (V) | Deposition rate (μm/h) at the edge | Deposition rate (μm/h) at the middle |
|---|---|---|---|---|---|---|
| P-DC | 10 kHz | 95 | 11 | −300 | 3 | 0.5 |
| P-DC | 5 kHz | 97.5 | 6 | −300 | 2.1 | 2.5 |

The bias was kept constant for both P-DC frequencies, and the bias during the DC discharge was set to a minimum to sustain the discharge, per the Paschen law that indicates the breakdown voltage of a discharge as a function of pressure and the distance between the electrodes. Because the energy of the electric field is more efficiently transferred to the electrons in RF (considering that the direction of the electron after a collision can coincide the reversal of the RF oscillation), the discharge breakdown can be done at a lower pressure compared to DC discharge. Consequently, depositions with the CW RF discharge had to be performed at a lower pressure (400 mTorr) compared to the P-Dc (750 mTorr), to have deposition conditions comparable with the DC and P-DC ones.

Results for Method 2)

FIGS. 5a to 5j show distributions of normalized light intensity profiles (FIGS. 5a-5b), coating thickness (FIGS. 5c-5d), energy dissipative x-ray (EDX) intensity (FIGS. 5e-5f), hardness (FIGS. 5g, 5h), and reduced Young's modulus (FIGS. 5i-5j) for both of the CW RF plasma method and for the pulsed direct current (P-DC) plasma method described above. All of the graphs for the P-DC method were obtained with a pulsing frequency of 5 kHz.

Figure 5A:
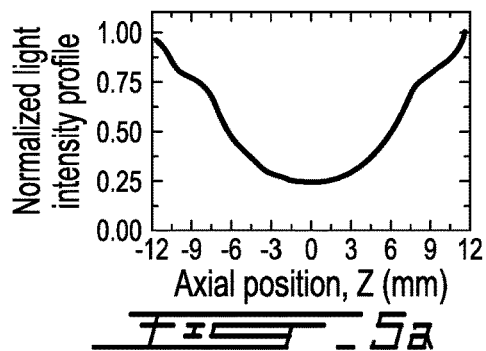
FIGS. 5a to 5j are graphs showing different properties of a TiN coating applied on the tube of FIG. 2A, and of plasma properties used to coat the tube, as a function of the axial position for a RF plasma coating method (FIGS. 5a, 5c, 5e, 5g, 5i) and for a pulsed direct current plasma (P-DC) coating method (FIGS. 5b, 5d, 5f, 5h, 5j)
Figure 5B:
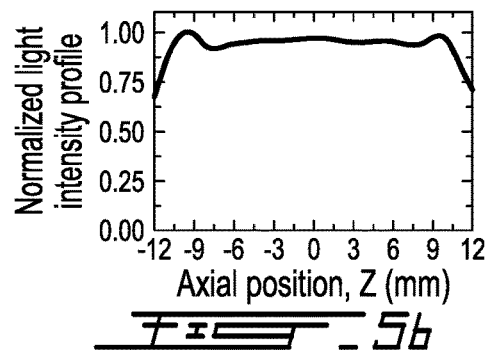
Figure 5C:
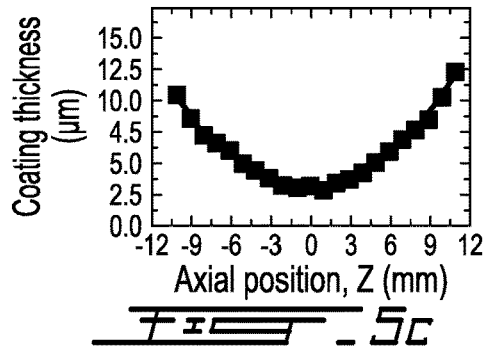
Figure 5D:
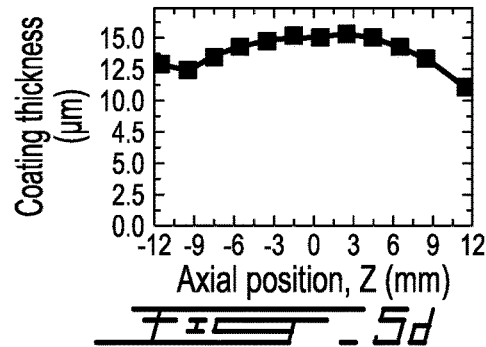
Figure 5E:
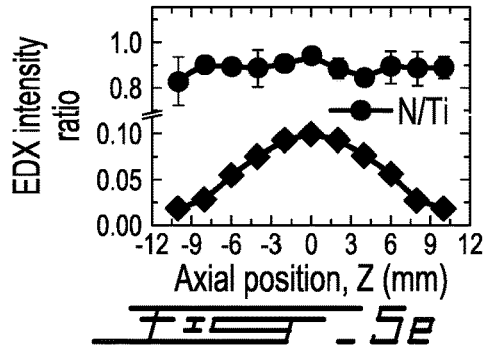

Although not shown, it was observed that the P-DC method with a frequency of 10 kHz yielded depositions in the middle of the tube, but the deposition rate was reduced by a factor of 6 compared to the edges. Referring to FIG. 5d, with a pulsing frequency of 5 kHz, the coating distribution obtained was substantially uniformity along the tube axis 34 (FIG. 2a). In fact, the deposition rate has been found to be slightly higher in the middle than at the edges of the tube 30. The thickness profile along the tube follows the same trend as the discharge light intensity profile shown in FIG. 5b.

In the case of CW RF, the results plotted in FIGS. 5a, 5c, 5e, 5g, and 5i show that all coating characteristics exhibited a significant non-uniformity. The Cl/Ti ratio exhibited an increase of about 80%, from 2% at the edges to 10% in the middle of the tube. In a similar fashion the coating thickness (80%) and the discharge light intensity (75%) decreased significantly towards the tube center. The coating hardness decreased from 28 GPa at the edges to 15 GPa in the middle (47%), only the N/Ti ratio, close to 0.9, and the Young's modulus, with a value of around 250 GPa, did not exhibit an important drop in the middle of the tube.

Figure 5F:
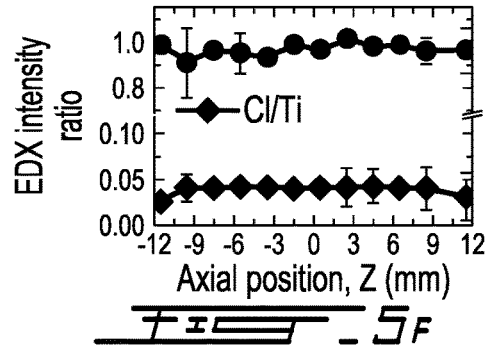
Figure 5G:
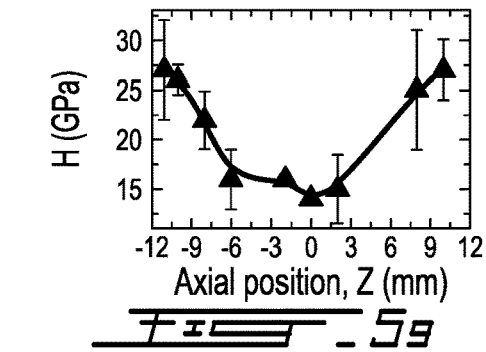
Figure 5H:
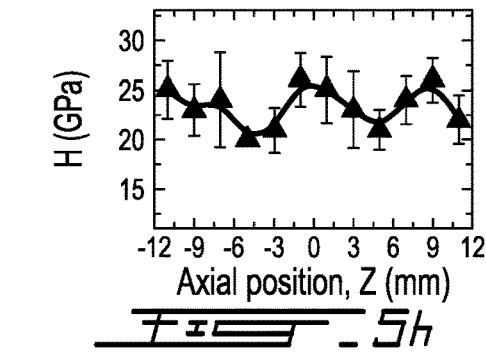
Figure 5I:
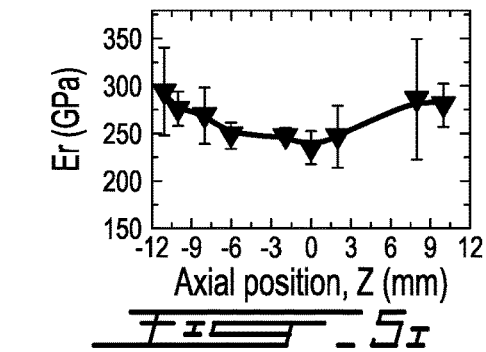
Figure 5J:
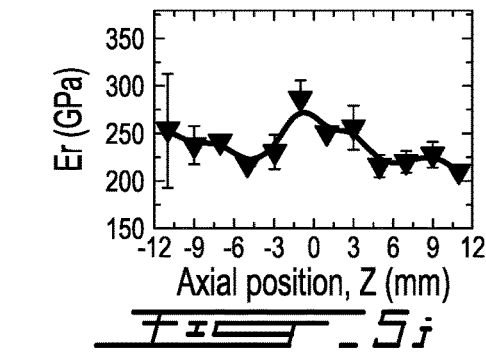

In the case of P-DC at a pulsed frequency of 5 kHz, the results plotted in FIGS. 5b, 5d, 5f, 5h, and 5j show that the coating properties have a much-enhanced uniformity (about 20% variations along the tube axis 34). Indeed, FIG. 5d shows that the coating thickness slightly rose from 12.5 μm at the edge to 15 μm in the middle of the tube (17%). FIG. 5f shows that the N/Ti ratio was close to stoichiometry, and that the Cl/Ti ratio remained below 0.05. FIG. 5h shows that the coating hardness is close to 25 GPa, and the Young's modulus remained around 225 GPa. All the coating properties seemed to follow the discharge light intensity plotted on FIG. 5b and which was more uniform than that for the CW RF mode, which is plotted on FIG. 5a. The discharge light intensity can be used as an indicator of a uniform distribution of the active species (for example $N_2^+$, N2*, $Ar^+$, Ar*). Therefore, in some instances, the coating thickness profile along the tube follows the discharge spatial distribution indicated by the light intensity.

The resulting coating hardness is sufficient to help reduce the erosion rate of the coated surface. If the typical hard alumina particles are used for a solid particle erosion resistance test, with a hardness of 20 GPa, then the TiN coating having a higher hardness, deposited with the process described herein, may be suitable for solid particle erosion resistance.

Figure 6:
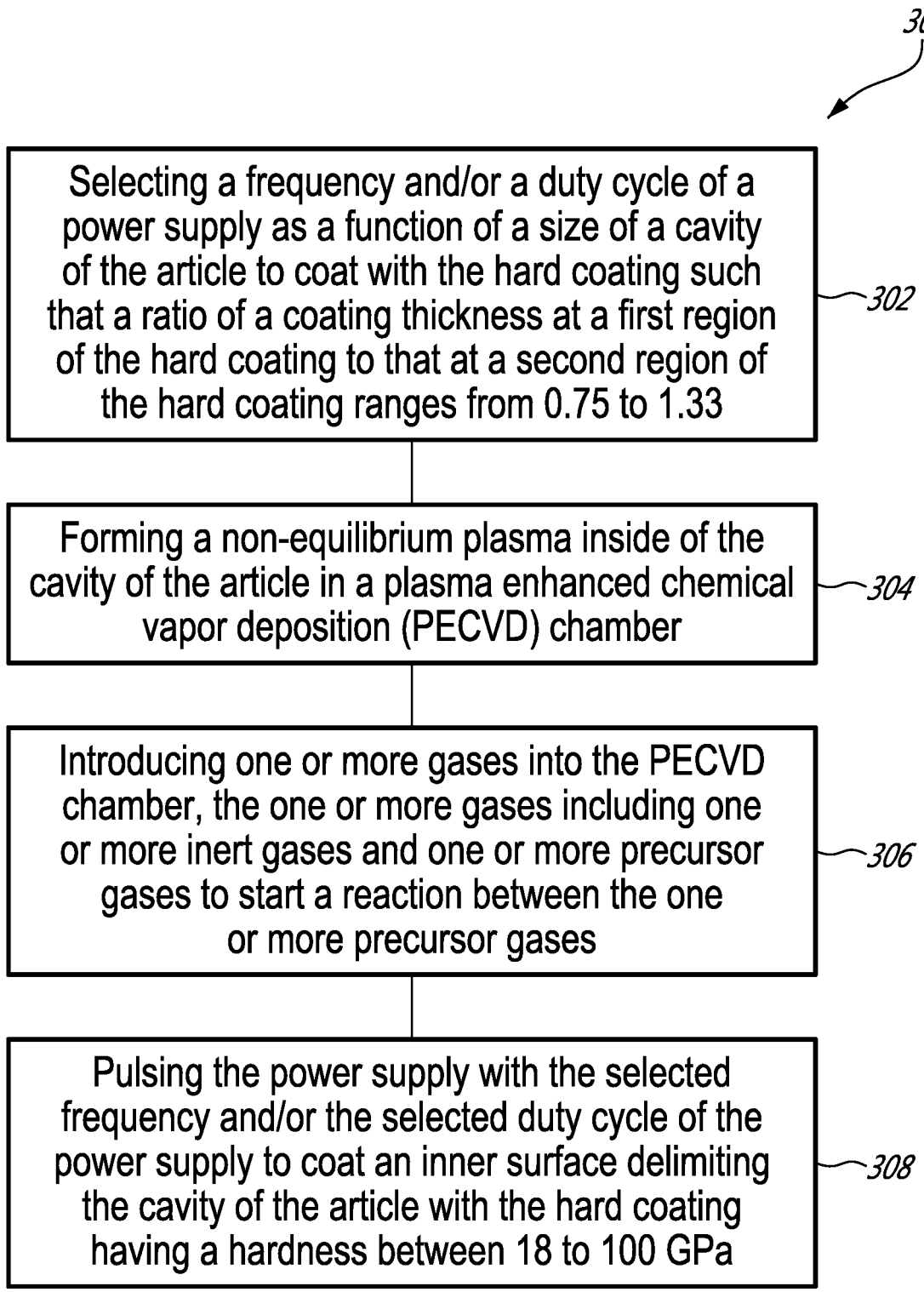
FIG. 6 illustrates steps of a method of coating an article of a different shape than the tube of FIG. 2A using a PECVD process.

Referring now to FIG. 6, a method of coating an article of any shape is shown at 300. The method 300 includes the steps of selecting a frequency and/or a duty cycle of a power supply as a function of a size of a cavity of the article to coat with the hard coating such that a ratio of a coating thickness at a first region of the hard coating to that at a second region of the hard coating ranges from about 0.75 to about 1.33, 302; forming a plasma inside of the cavity of the article in a plasma enhanced chemical vapor deposition (PECVD) chamber, 304; introducing one or more gases into the PECVD chamber, the one or more gases including one or more inert gases and one or more precursor gases to start a reaction between the one or more precursor gases 306; and pulsing the power supply with the selected frequency and/or the selected duty cycle of the power supply to coat an inner surface delimiting the cavity of the article with the hard coating having a hardness between about 18 to about 100 GPa 308. It will be appreciated that the step 304 of forming the plasma includes at least some of the steps of the method 200 described above with reference to FIG. 3b.

In the present case, an optimal frequency and/or an optimal duty cycle of the power supply 123A (FIG. 3A) to obtain the hard coating having the hardness between about 18 to 100 GPa and the ratio of the coating thickness ranging from 0.75 to 1.3 is selected. The pulsing of the power supply with the selected duty cycle may include pulsing the power supply 123A at the duty cycle from about 1% to about 100%, preferably at from about 25% to about 100%. In some cases, the duty cycle may be from about 1% to about 25% and in other cases between about 25% and about 50% or between about 50% and about 100%. Although the diffusion of the gases may not a limiting factor in the present method, lower duty cycles may be contemplated to balance the effect of a too pronounced ion sputter-etching and heating of the substrate if the plasma ON period is too long. The pulsing of the power supply 123A with the selected frequency includes pulsing a direct current of the power supply through the article at the selected frequency ranging from about 100 Hz to about 100 kHz, preferably from about 1 kHz to about 100 kHz, preferably from about 3 kHz to about 10 kHz, preferably about 5 kHz. In a particular embodiment, a pressure in the PECVD chamber 120 is pulsed and/or one or more flow rates of the one or more introduced gases is pulsed.

While the exact values of optimal frequency, duty cycle and discharge voltage depend on the particular geometry of the article to be coated, gas mixture and pressure, the general guideline to obtain uniform deposition is to assess the uniformity of the discharge inside the cavity. One way to monitor the discharge uniformity is to perform the following two steps. First, make a slit along the substrate to be coated and calculate the discharge filling factor using image analysis techniques. Second, adjust the discharge parameters to obtain the discharge filling factor greater than 90%.

The discharge filling factor is calculated as follows:

$$K_f = \frac{\int I_T dl}{\int dl} \cdot 100$$

where l is the tube length, $l_T$ is a normalised local light intensity along the tube, as a function of the discharge voltage ($V_d$) for the DC and P-DC discharges and used to assign a value to the different profiles.

Referring now to FIGS. 7a and 7b, the discharge filling factor and the total light intensity ratio are plotted in function of the voltage. As shown, the discharge filling factor is at about 90% when the voltage is between −260 and −325 V and the frequency is 25 kHz or less. The intensity ratio is also greater for those conditions of voltage and frequencies.

Figure 9:
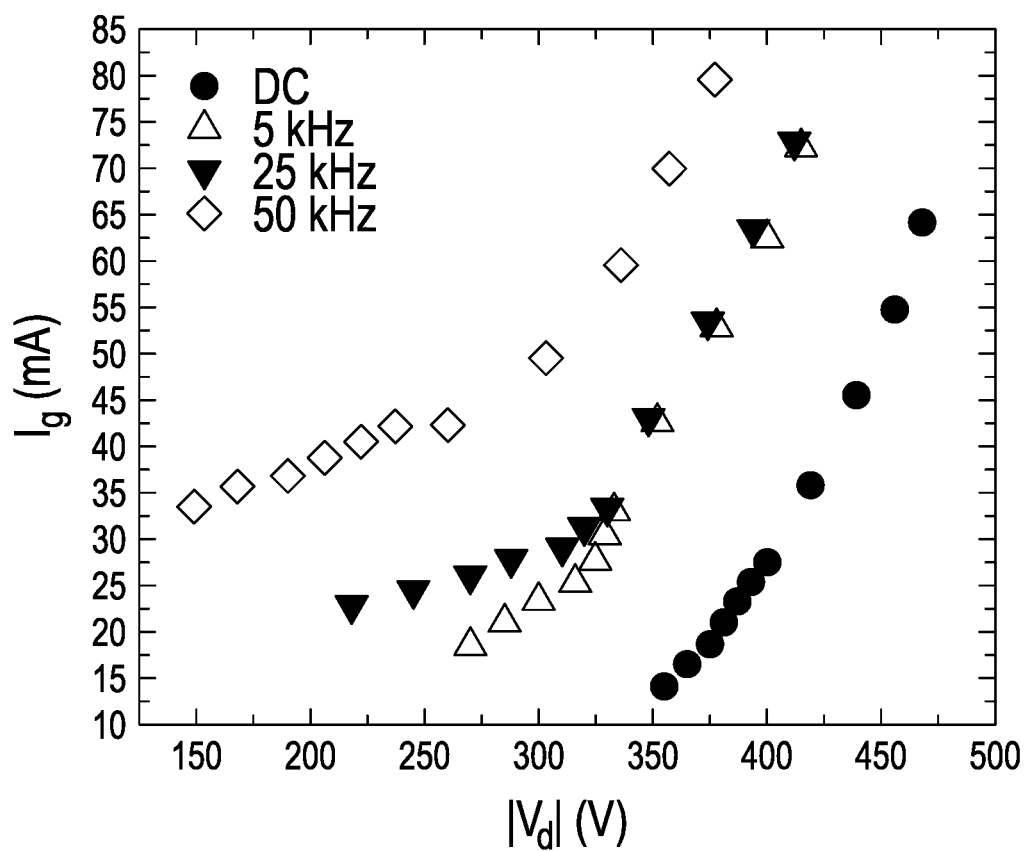
FIG. 9 is a graph showing the average current measured at the generator level in function of the voltage.

An alternative option to determine the frequency and/or duty cycle is to maintain the initial frequency and duty cycle substantially constant and perform a voltage scan while recording the discharge current. A plot of the current intensity (I) in function of the voltage (V) can then be drawn. Such a plot is shown in FIG. 9. The zone of main interest in the curve of the plot will be near a kink (change of slope) of the I-V characteristics. If this kink is not observed then the frequency must be increased. The lowest possible frequency that presents a kink in the I-V curve may provide uniformity while preserving the hard coatings' mechanical properties. In this case, a 5 kHz frequency is the lowest frequency at which the I-V curve presents a change of slope.

After learning the present technology from the present disclosure, the person skilled in the art will be able to use the present technology to coat parts other than those disclosed herein with other coatings than those described herein and/or other coatings and/or apply other coatings having different thicknesses, properties, as may be desired for different applications, using the principles described herein.

As shown in FIG. 9, the average current measured at the generator level (Ig) as a function of Vd for the DC and P-DC discharges is presented. In some embodiment, for all frequencies, Ig increases with Vd, however, at different rates. Two distinct regimes can be noticed: a) slow increase of Ig at Vd below ~320 V, and b) faster increase of Ig at higher Vd values. In some embodiments, the precise Vd value at which such transition occurs does not depend on the pulse frequency (could not be achieved in the case of DC since |Vd|>350 V was required to ignite the discharge).

The optimal voltage and frequency may increase when reducing the tube diameter. Regarding the duty cycle, its high value may be advantageous for increasing the deposition rate as well as of the film density and hardness due to the ion bombardment during the time ON. In some configurations one will need to reduce the duty cycle (for example to 50% or even 25%) to balance the effect of a too pronounced ion sputter-etching and article heating if the plasma ON period is too long.

The graphs of FIGS. 7a and 7b are obtained as follows. A PECVD deposition chamber was evacuated by a mechanical pump and a diffusion pump to a base pressure below $1.10^{-5}$ Torr. A P-DC power was supplied from the Advanced Energy Pinnacle Plus unit (5 kW). The same average power values were used for all pulse frequencies, and the P-DC duty cycle was kept constant at 97.5%. The hollow cathode was made of SS410 with an internal diameter of 7 mm and a length of 25 mm, resulting in an aspect ratio (length over the diameter) L/D of 3.6. To facilitate access to the light inside the tube without significant perturbations of the discharge, a narrow slit of about 1 mm width was made all along the cathode axis using a diamond saw, and the edges were then deburred. The inner surface of the cathode was polished to a mirror-like finish, cleaned successively in a degreasing solution, acetone and isopropanol during 10 min each step using an ultrasonic bath. The experimental conditions used are summarized in the table below. Images of the discharge through the chamber window and the tube slit were taken with a Nikon D7100 digital camera and fitted with 18-70 lenses. Exposure time was manually set for each picture to maximize light intensity without saturation.

| Condition | Value |
| --- | --- |
| P-DC frequencies (kHz) | 5 - 25 - 50 |
| Power (W) | 5 - 30 |
| Substrate temperature (° C.) | 450 |
| Pressure (mTorr) | 750 |
| Argon (sccm) | 175 |
| Nitrogen (sccm) | 25 |
| Hydrogen (sccm) | 90 |
| TiCl$_4$ (sccm) | 10 |

Normalized total light intensity $I_T$ profiles along the tube axis of the DC and P-DC discharges at 5 kHz, 25 kHz, and 50 kHz, are shown in FIG. 8 for different frequencies and power levels. Concave profiles correlate with uniformity of coating along the tube axis whereas convex coating do not. Uniform discharges were observed when the bias values were between −60 and −325 V. Further, it was observed through optical emission spectroscopy (OES) measurements that there was a certain critical discharge electron density threshold situated around $10^{12}$ cm$^{-3}$ at which the profile started to be convex. The line indicating 0.8 of the total light intensity is used as a guide. Low is 5 W, medium is 11 W and high is 20 W. In the case of the DC discharge, for 5 W, $I_T$ increased from 0.3 at the edges to 1.0 in the middle. At 11 W and 20 W, $I_T$ started around 0.4 at the edges and is close to 1.0 in the center, with a similar trend as 5 W. All profiles at 20 W were identical at all frequencies studied. In the case of P-DC, for 5 kHz at 5 W, the total light intensity rapidly increased from 0.7 to 0.9 along the first 2.0 cm from the edges to the middle, and it then only slightly increased to 1.0 towards the middle. At 11 W, $I_T$ starts at 0.7 at the edges, and it sharply increased to 1.0 at the tube center. For the P-DC discharge at 25 kHz at 5 W, $I_T$ decreased from 1.0 at the edges to 2.0 in the middle, while at 11 W, $I_T$ increased from 0.6 at the edges to 1.0 in the middle. At 50 kHz, $I_T$ was almost 0 in the middle of the tube, while it was 1.0 at the edges. The same shape was observed at 11 W, but this time, $I_T$ was 0.4 in the middle of the tube.

In the analysis different signs were not assigned to the concave and convex profiles, but in the context of this work they were readily distinguishable: the values of $K_1$<55% represent concave profiles, while higher values represent convex profiles as can be seen in FIG. 10. The values within the region where there was no pattern (Kf>87%) correspond to the most uniformly distributed discharge profiles accessible within the parameters studied.

The most uniform discharge axial distribution leads to the most uniform axial distribution of the TiN coating properties (thickness, hardness, stoichiometry). For this reason, the region where the discharge had a filling factor of around 90% was of practical interest. It follows from the experimental evidence that the discharge spatial distribution depended on the $V_d$ parameter, which itself was determined by the frequency at a given power. In fact, the minimum $|V_d|$ accessible in the present system with a DC discharge was 350 V (<5 V.

A closer look to the 260<$|V_d|$<340 V region in FIGS. 7a shows that the $I_T$ for the P-DC at 5 kHz was the most uniform with a value increasing from 89 to 91% from −270 to −320 V (over a range of 50 V). The $I_T$ of the P-DC at 25 kHz showed that the discharge reached best uniformity between 88 and 89% over a range of 20 V (270<$|V_d|$<290 V). In the case of P-DC at 50 kHz, the maximum value of $K_f$ measured in the context of this work was 89% and the overall values seemed to follow the same trend as the one at 25 kHz. In the region of $|V_d|$<270 V, the distribution was concave with the same value of $K_f$ around 42.5% independently of the pulse frequency, and the transition was sharp, typically from 45% to 90% within less than 25 V. Beyond the region $|V_d|$>330 V, the distribution was convex with the filling factor slowly decreasing towards a plateau around 80% for all the P-DC frequencies. In the case of DC, $K_f$ increased from 75% to 85% between 350 and 450 V, and then decreased to 80%, never reaching the region of interest, around 90%.

From the pictures of the discharge, it was noticed that the light outside the hollow cathode varied in intensity with both the power and the frequency. FIG. 7b shows the ratio of the total light intensity measured inside the cathode over the one measured outside as a function of $V_d$ for the DC and P-DC frequencies. This can represent the degree of confinement of the discharge inside the hollow cathode. At 25 and 50 kHz, the ratio was unity below −260 V, and it increased from 1 to 10 before reaching a plateau around 22 at −350 V. The ratio increased rapidly from 10 to 22 in the transition between the region where the discharge was the most uniform and the convex region (−325 to −350 V). At 5 kHz, the ratio was higher than for the other P-DC frequencies, but it slowly decreased from 16 to 12 in the range from −260 to −320 V, before following the same trend as the other P-DC frequencies. In the case of DC, the ratio started around 28, and it decreased until −425 V to reach the same plateau as the P-DC.

The concave profile of the discharge corresponded to the lowest degree of confinement and the convex profile corresponded to the highest one, while the most uniform profile had a degree of confinement lying in between. The discharge was therefore the most uniform at 5 kHz, in line with the results of Example 3, and over a range of $V_d$ wider (50 V) than at higher frequencies (25 V). In addition, it appears that the least confined discharges inside the hollow cathode (<−260 V) had a concave profile. Moreover, the rapid increase of the line intensities occurred in the region where the discharge was the most uniform.

It will be appreciated that many variations in the coating method are contemplated. For instance, the power supplied, P-DC, includes high and low duty cycle pulses (impulses), pulse trains, alternative polarity pulses, and the like. In this embodiment, the plasma is a low temperature non-equilibrium plasma, as is known in the art and referred to herein as non-equilibrium plasma. Herein, low temperature implies a temperature within a range of from 20 to 800 degrees Celsius. The PECVD chamber may be evacuated to a base pressure of $10^{-2}$ mTorr. The pressure in the PECVD chamber may be below 400 mTorr during coating deposition. Two or more of the gases or all of the gases may be pre-mixed at some stage and introduced through one inlet. The geometry of the inlets depends on the particular process, chamber and substrate geometry. In some embodiments, the flow of some gases can be changed at any particular moment of the process. For example, the one or more flow of the one or more precursor gases and/or the one or more flow of the one or more reactive gases can be set to zero at the beginning to plasma-clean the inner surface of the article, then the necessary flow or flows of precursor gases is/are provided in the plasma to start a reaction 14 between the one or more precursor gases (and in certain embodiments the one or more reactive gases) to form the coating for the inner surface. The one or more inert gases may include Ar, Ne, He or any combination thereof.

The one or more reactive gases may include nitrogen, hydrogen, and/or oxygen, for example $N_2$, $H_2$, $NH_3$, $O_2$, $N_2O$ and hydrocarbons. The one or more precursor gases may include Ti containing gases such as $TiCl_4$ or $[(CH_3)_2N]_4Ti$. The one or more precursor gases may further include one or more of Cr, Al, B, C, O, Si, V, Nb, Y, Zr, Mo, Hf, Ta and W atoms in their chemical structure. The examples of such precursor gases are given below but not limited by this list: $Cr(C_5H_7O_2)_3$, $CrF_5$, $AlCl_3$, $AlMe_3$ (trimethyl aluminum), $(Me_2N)_3Al$, $B_2H_6$, $(Me_2N)_3B$, $B(C_2H_5)_3$, $CH_2$, $C_2H_2$, $SiH_4$, $(Me_2N)_4Si$, $[(CH_3)Si]_2NH$ etc.

The process may be optimized to determine an optimized frequency and an optimized duty cycle that produce the desired coating. The optimization can be performed by varying the frequency and duty cycle parameters for the same geometry of the concave inner surface until the hard coating is uniformly distributed on the concave inner surface, such that a ratio of the coating thickness between any two regions of the hard coating is uniform as defined above. It is possible that the optimization determines that two or more frequencies or duty cycles should be used. The pulse itself can be of any shape. In some embodiments the negative voltage pulse is rectangular. In some embodiments the negative voltage pulse is followed by positive voltage pulse. In some embodiments the negative voltage pulse is superimposed with negative DC signal. In some embodiments, sinusoidal or other wave shape mid-frequencies can be used. Furthermore, the flow of some gases may be varied at any particular moment of the process. For example, the one or more flows of the one or more precursor gases can be set to zero at the beginning to plasma-clean the substrate, and only then the one or more gases of one or more precursor gases are provided in the plasma to start the reaction between the one or more precursor gases to form the coating for the inner surface to obtain a concave inner surface coated with a hard coating.

One way of determining the frequency and/or the duty cycle is to measure the discharge power (or current) as a function of Vd. Then the region just before the change of the P(V) slope can be used as an indication of where the discharge is the most uniform which in turn leads to a uniform coating. Thus, in this region, the probability to obtain a uniform coating may be the highest.

Gas flows and/or the pressure may further be pulsed to coat the surface of an inner cavity of an article. The hard coating resistant to SPE obtained on the inner surface of the article by the present method may be a hard polycrystalline coating, a hard X-ray amorphous coating, a hard nanocomposite coating or a hard nanolaminate coating.

It will be appreciated that many parameters may be tuned to achieve a desired coatings, the tuning of these parameters will be come apparent in view of the present disclosure. For instance, each of the gases may be introduced through separate inlets; two or more gases or even all gases may be pre-mixed at some stage and then introduced through one inlet as one gas flow; the geometry of the inlets depends on the particular process, chamber and substrate geometry; the working pressure is determined by a balance between the total gas flow and the pumping speed; the pumping speed may be adjusted by one or more throttling valves installed between the chamber and the pump; the electric power supplied may be DC, pulsed DC, mid-frequency and RF or a combination thereof. Pulsed DC may include high and low duty cycle pulses (impulses), pulse trains, alternative polarity pulses etc.

Definitions

The term "polycrystalline" as used herein means crystals with different orientations and having the same or different crystalline structure. Polycrystalline materials may be transition metal nitrides or oxynitrides, carbides, carbonitrides, borides and their combination. The term "X-ray amorphous" as used herein in the context of a coating means that the crystal size of the grains of the coating are X-ray amorphous, but detectable by transmission electron microscope. The term "nanocomposite" as used herein in the context of a coating means that the coating is formed by hard nanoparticles in an amorphous matrix in the size of 20 nm and below or 10 nm and below. The term "nanolaminate" as used herein in the context of a coating means that the coating is formed by a stacking of individual layers, each with a thickness in the range of nanometers or tens of nanometers. The term "solid particle erosion" or "SPE" as used herein means the loss or displacement of matter of an article due to the impact of solid matter transported in a fluid and impacting the article. Solid particle erosion may occur in conjunction with corrosion. The term "corrosion" as used herein means the loss or displacement of matter of an article due to chemical action as is known in the art. Corrosion may refer to one or more of the subtypes: hot corrosion, galvanic corrosion, and pitting corrosion. The term "resistant to SPE" as used herein with respect to a coating applied to a surface means that the coating, when present on the surface and subjected to a set of SPE testing or operating conditions, is more resistant to SPE in that set of conditions than the uncoated surface when subjected to the same set of conditions. The term "erosion rate" or "ER" as used herein means the amount of mass or volume loss from a surface after being impacted by a given mass of solid matter or as a function of time under constant exposure conditions of the article to the solid particle erodent. The "erosion improvement factor" or EIF as used herein, is defined as the ratio of the ER of the uncoated article material over the ER of the coated material: $ER_{substrate}/ER_{coating}$. In some embodiments, the EIF of the coated surface needs to be at least 3, independently of the SPE exposure conditions. For example the EIF may be between 3 to 10, 10 to 40, 3 to 100, 10 to 100 or 40 to 100. The term "hollow cathode discharge" or "HCD" is used herein for a cathode with a cavity-like geometry, such that the plasma is enclosed or partially bound by the walls that are at the cathode potential. In such geometry the electric field inside the cavity might lead to the electron trapping by so-named pendulum effect resulting in a higher plasma density. The particular conditions of making the hollow cathode discharge stable and uniform inside a concave cavity constitute an improvement of the present disclosure over the prior art. The term "uniform" or "uniformly" as used herein when referring to the thickness of a coating, means that a ratio of the coating thickness between any two regions of the coating is between about 4:3 to about 1:1, preferably between about 5:4 to about 1:1, preferably between about 6:5 to about 1:1.

The coating may be distributed on the inner surfaces described above such that no part of the surface of the inner cavity has a thickness of zero in deposited hard coating. In the present disclosure, the expression "about" means that a value may range from plus or minus 10% of said value. For instance, about 10 means from 9 to 11.

It was shown that low frequency-high duty cycle P-DC PECVD can be used in accordance to the present method to effectively fabricate uniform TiN coatings inside concave cavities of articles of simple and complex shapes, for example a narrow tube. It offers additional advantages compared to DC by avoiding arcing and a better control of the power. In fact, with the decrease of the average power, the coating thickness distribution becomes more uniform. This can also be attributed to the uniform spatial distribution of the discharge. In fact, the power necessary to obtain a discharge without the drop of intensity in the middle of the tube is lower in the case of P-DC discharges than in the case of the CW RF discharge.

The discharge at around 5 kHz (from 1 to 10 kHz) is of particular interest as it seems to benefit from an electron density high enough to allow the development of an electric field inside the cavity, but sufficiently low enough that not too many electrons are lost to the anode and the electric field rearranges itself to slow it down. A regime where the discharge is the most uniform, allows for the coating distribution along the inner surface of the cavity to be uniform as well.

The article to be coated (substrate) can be any conductive material. The article may be made of one of titanium alloys, steels (for example stainless steels and corrosion resistant steels), nickel alloys, aluminum alloys, magnesium alloys, and any combination thereof. Substrate can also be composed of the listed alloys coated with a coating that would serve as an interface/inner surface as described herein.

Embodiments disclosed herein include:

A. An article comprising: a cavity defined by an inner surface, the cavity having a size such that a largest sphere placeable in the cavity has a diameter of less than 7 cm and a smallest sphere placeable in the cavity has a diameter of 0.5 mm; and a hard coating on the inner surface, the hard coating having a hardness between 18 to 100 GPa, the hard coating distributed on the inner surface such that a ratio of a coating thickness at a first region of the hard coating to that at a second region of the hard coating ranges from 0.75 to 1.33.

Embodiment A may include any of the following elements, in any combinations:

Element 1: the ratio of the coating thickness ranges from 0.8 to 1.25. Element 2: the hard coating is a polycrystalline, nanocomposite, nanolaminate or X-ray amorphous coating. Element 3: the inner surface of the article is metallic. Element 4: the hard coating has a thickness of from 2 to 30 μm. Element 5: the hard coating is polycrystalline. Element 6: the hard coating is one of TiN, TiCN, TiSiN, or TiSiCN. Element 7: the article is a diffuser pipe, a diffuser case, a turbine blade, or a turbine disk of a gas turbine engine.

B. A method of coating an article with a hard coating, the method comprising: selecting a frequency and/or a duty cycle of a power supply as a function of a size of a cavity of the article to coat with the hard coating such that a ratio of a coating thickness at a first region of the hard coating to that at a second region of the hard coating ranges from 0.75 to 1.33; forming a non-equilibrium plasma inside of the cavity of the article in a plasma enhanced chemical vapor deposition (PECVD) chamber; introducing one or more gases into the PECVD chamber, the one or more gases including one or more inert gases and one or more precursor gases to start a reaction between the one or more precursor gases; and pulsing the power supply with the selected frequency and/or the selected duty cycle of the power supply to coat an inner surface delimiting the cavity of the article with the hard coating having a hardness between 18 to 100 GPa.

C. A method of coating an article, the article defining an internal passage delimited by an inner surface, the method comprising: vacuuming the inside of the PECVD chamber containing the article; heating the article inside the PECVD chamber; injecting one or more gases into the PECVD chamber, the one or more gases including one or more inert gases and one or more precursor gases including a titanium precursor gas; circulating an electric current through the article while the article is inside the PECVD chamber; and coating the article by forming a non-equilibrium plasma inside of the internal passage of the article and pulsing the electric current at a given frequency and/or at a given duty cycle such that a ratio of a coating thickness at a first region of the hard coating to that at a second region of the hard coating ranges from 0.75 to 1.33 and that a hardness of the hard coating is at least 18 GPa.

Embodiments B and C may include any of the following elements, in any combinations:

Element 8: selecting the frequency and/or the duty cycle includes assessing a uniformity of a discharge of the non-equilibrium plasma inside the cavity by calculating a discharge filling factor using image analysis techniques, and adjusting the frequency and/or duty cycle until the discharge filling factor is above 87%. Element 9: selecting the frequency and/or the duty cycle includes obtaining a curve of a current intensity of a pulsed direct current in function of a voltage while maintaining the frequency and the duty cycle constant, and adjusting the frequency and/or the duty cycle of the pulsed direct current to determine a lowest value of the frequency where the curve presents a change of slope. Element 10: the pulsing of the power supply with the selected duty cycle includes pulsing the power supply at the duty cycle from 25% to 100%. Element 11: the pulsing of the power supply with the selected frequency includes pulsing a direct current of the power supply through the article at the selected frequency ranging from 500 Hz to 500 kHz. Element 12: the pulsing of the direct current includes pulsing the direct current at a direct current frequency ranging from 1 kHz to 50 kHz. Element 13: the pulsing of the direct current includes pulsing the direct current at the direct current frequency ranging from 5 kHz to 10 kHz. Element 14: the pulsing of the direct current includes pulsing the direct current at the direct current frequency of 5 kHz. Element 15: the method further comprises pulsing a pressure in the PECVD chamber and/or pulsing one or more flow rates of the one or more introduced gases. Element 16: coating the article includes coating the article having an effective aspect ratio of 3.6, the effective aspect ratio defined by a ratio of a length to a mean hydraulic diameter of the article, the mean hydraulic diameter is a mean of a plurality of hydraulic diameters of the internal passage taken at a plurality of locations along a central axis of the internal passage, each of the plurality of the hydraulic diameters being a ratio of four times a cross-sectional area of the internal passage at a respective one of the plurality of locations taken along a plane normal to the central axis to a perimeter of the internal passage at the respective one of the plurality of locations. Element 17: the vacuuming of the inside of the PECVD chamber includes vacuuming the inside of the PECVD chamber to a pressure of 750 mTorr, injecting the one or more gases includes injecting argon at a volumetric flow rate of 175 sccm of argon, injecting nitrogen at a flow rate of 25 sccm, injecting hydrogen at a flow rate of 90 sccm, and injecting TiCl4 at a flow rate of 10 sccm, wherein the pulsing of the power supply includes pulsing the power supply at the given frequency of 5 kHz, and wherein heating the article includes heating the article at a temperature ranging from 400 to 500 degrees Celsius.

The embodiments described in this document provide non-limiting examples of possible implementations of the present technology. Upon review of the present disclosure, a person of ordinary skill in the art will recognize that changes may be made to the embodiments described herein without departing from the scope of the present technology. Yet further modifications could be implemented by a person of ordinary skill in the art in view of the present disclosure, which modifications would be within the scope of the present technology.

The invention claimed is:

1. An article comprising: a cavity defined by an inner surface, the cavity having a size such that a largest sphere placeable in the cavity has a diameter of less than 7 cm and a sphere having a diameter of 0.5 mm can be placed to occupy any point in the cavity; and a hard coating on the inner surface, the hard coating having a hardness between 18 to 100 GPa, the hard coating distributed on the inner surface such that a ratio of a coating thickness at a first region of the hard coating to that at a second region of the hard coating ranges from 0.75 to 1.33.

2. The article according to claim 1, wherein the ratio of the coating thickness ranges from 0.8 to 1.25.

3. The article according to claim 1, wherein the hard coating is a polycrystalline, nanocomposite, nanolaminate or X-ray amorphous coating.

4. The article according to claim 1, wherein the inner surface of the article is metallic.

5. The article according to claim 1, wherein the hard coating has a thickness of from 2 to 30 µm.

6. The article according to claim 1, wherein the hard coating is polycrystalline.

7. The article according to claim 1, wherein the hard coating is one of TiN, TiCN, TiSiN, or TiSiCN.

8. The article according to claim 1, wherein the article is a diffuser pipe, a diffuser case, a turbine blade, or a turbine disk of a gas turbine engine.

* * * * *